US011282900B2

(12) United States Patent
An et al.

(10) Patent No.: US 11,282,900 B2
(45) Date of Patent: Mar. 22, 2022

(54) DISPLAY DEVICE WITH DUMMY PIXELS IN A NON-DISPLAY AREA

(71) Applicant: Samsung Display Co., Ltd., Yongin-Si (KR)

(72) Inventors: Junyong An, Yongin-si (KR); Hyunae Park, Yongin-si (KR); Hyungjun Park, Yongin-si (KR); Seungwoo Sung, Yongin-si (KR); Youngsoo Yoon, Yongin-si (KR); Ilgoo Youn, Yongin-si (KR); Jieun Lee, Yongin-si (KR); Yunkyeong In, Yongin-si (KR); Donghyeon Jang, Yongin-si (KR); Junyoung Jo, Yongin-si (KR)

(73) Assignee: Samsung Display Co., Ltd.

( * ) Notice: Subject to any disclaimer, the term of this patent is extended or adjusted under 35 U.S.C. 154(b) by 0 days.

(21) Appl. No.: 16/698,881

(22) Filed: Nov. 27, 2019

(65) Prior Publication Data

US 2020/0176527 A1    Jun. 4, 2020

(30) Foreign Application Priority Data

Nov. 30, 2018    (KR) .......................... 10-2018-0153024

(51) Int. Cl.
    *H01L 27/32* (2006.01)
(52) U.S. Cl.
    CPC ...... *H01L 27/3223* (2013.01); *H01L 27/3246* (2013.01); *H01L 27/3262* (2013.01); *H01L 27/3265* (2013.01); *H01L 27/3276* (2013.01)
(58) Field of Classification Search
    CPC ............. H01L 27/3223; H01L 27/3262; H01L 27/3276; H01L 27/3246; H01L 27/3265

USPC .................. 257/40, 88, 89, E27.119, E27.12
See application file for complete search history.

(56) References Cited

U.S. PATENT DOCUMENTS

| 8,890,181 | B2 | 11/2014 | Wang et al. |
| 9,922,586 | B2 | 3/2018 | Park et al. |
| 9,940,888 | B2* | 4/2018 | Ryoo ................. H01L 27/3276 |
| 10,108,149 | B2 | 10/2018 | Kang et al. |
| 2017/0294502 | A1 | 10/2017 | Ka et al. |
| 2018/0067357 | A1* | 3/2018 | Katsuta ............... H01L 27/3276 |
| 2018/0219058 | A1 | 8/2018 | Xiang et al. |

(Continued)

FOREIGN PATENT DOCUMENTS

| KR | 10-2016-0053051 A | 5/2016 |
| KR | 10-2016-0147116 A | 12/2016 |
| KR | 10-2018-0049296 A | 5/2018 |

OTHER PUBLICATIONS

Extended European Search Report, Application No. 19211845.3, dated Jan. 15, 2020, 8 pages.

*Primary Examiner* — Matthew E. Gordon
(74) *Attorney, Agent, or Firm* — Innovation Counsel LLP

(57) ABSTRACT

Provided is a display panel including a substrate, a plurality of pixels arranged on a display area of the substrate, a plurality of dummy pixels arranged on a non-display area of the substrate and emitting no light, and a plurality of signal lines configured to electrically connect the plurality of pixels to the plurality of dummy pixels, wherein some of the plurality of dummy pixels are arranged between a first region and a second region of the substrate. Accordingly, when static electricity is generated around the first region and/or the second region, the dummy pixels serves as a buffer to prevent a large voltage transmitted to the pixels to protect the display device.

20 Claims, 20 Drawing Sheets

(56) References Cited

U.S. PATENT DOCUMENTS

2018/0315357 A1   11/2018  Nam et al.
2019/0164954 A1*   5/2019  Yang .................... H01L 27/156

* cited by examiner

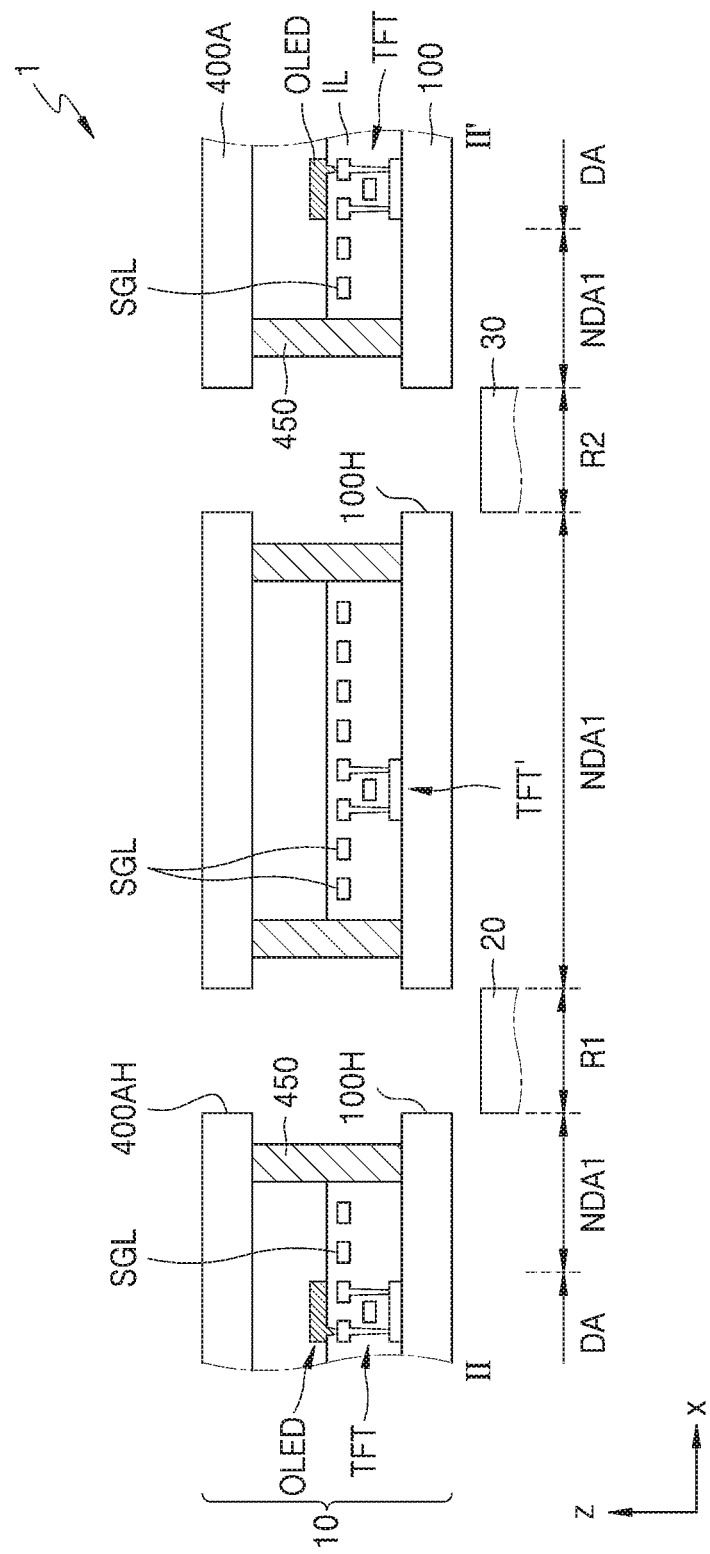

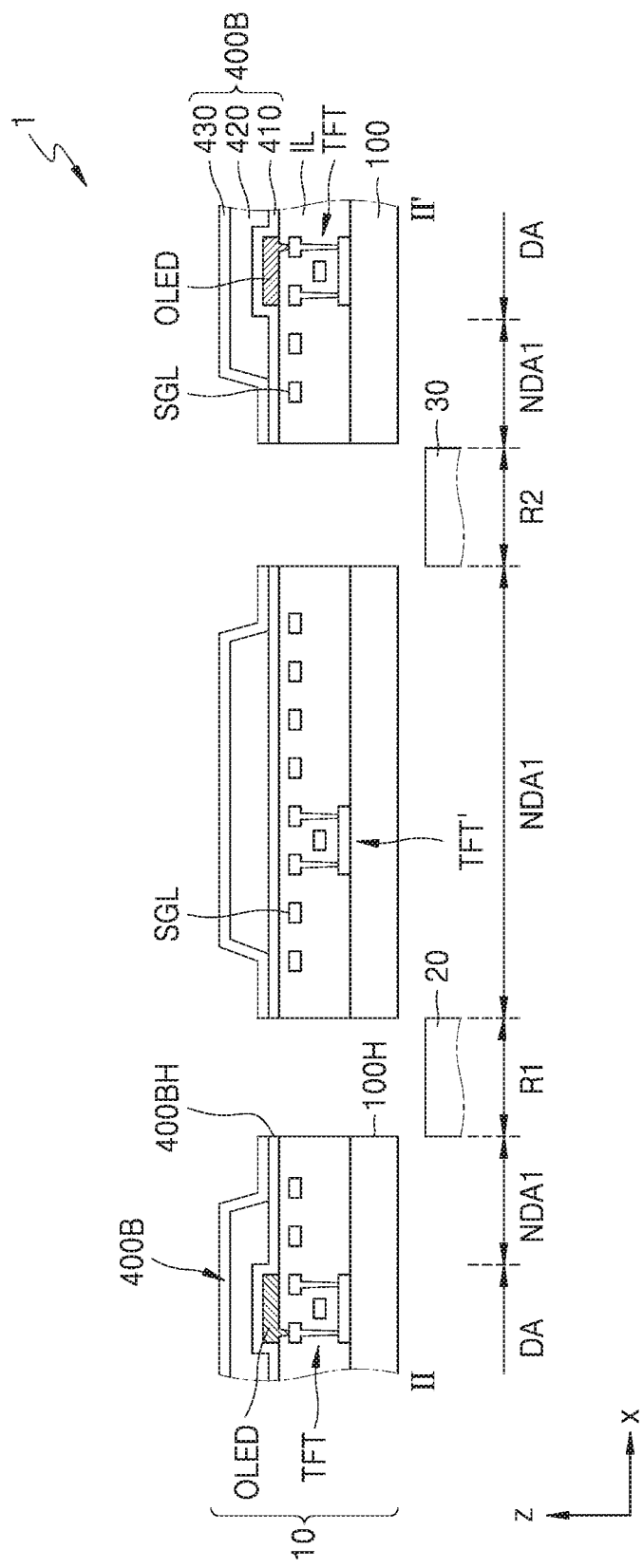

DISPLAY DEVICE WITH DUMMY PIXELS IN A NON-DISPLAY AREA

CROSS-REFERENCE TO RELATED PATENT APPLICATION

This application claims priority to and the benefit of Korean Patent Application No. 10-2018-0153024, filed on Nov. 30, 2018, in the Korean Intellectual Property Office, the disclosure of which is incorporated herein in its entirety by reference.

BACKGROUND

1. Field

One or more embodiments relate to a display panel.

2. Description of the Related Art

In today's world, conventional display devices have more applications than ever. The increasing range of applications is enabled by their relatively small thickness and light weight.

Given that display devices are utilized in different ways, various methods may be used to design the shapes of display devices, and functions that may be applied or linked to display devices increase.

SUMMARY

One or more embodiments include, as a method of increasing a function that may be connected or linked to a display device, a display panel including areas in which a camera, a sensor, etc. may be arranged inside a display area, and a device including the display panel.

However, the one or more embodiments are only examples, and the scope of the disclosure is not limited thereto.

Additional aspects will be set forth in part in the description which follows and, in part, will be apparent from the description, or may be learned by practice of the presented embodiments.

According to one or more embodiments, a display panel includes a substrate including a first region, a second region, a non-display area that surrounds the first region and the second region, and a display area that surrounds the non-display area; a plurality of pixels arranged on the display area; a plurality of dummy pixels arranged on the non-display area and emitting no light; and a plurality of signal lines configured to electrically connect the plurality of pixels to the plurality of dummy pixels, wherein some of the plurality of dummy pixels are arranged between the first region and the second region.

The plurality of dummy pixels may be arranged to surround the first region and the second region.

Each of the plurality of pixels may include a pixel circuit and a display element, the pixel circuit including at least one transistor and the display element being connected to the pixel circuit. Each of the plurality of dummy pixels may include a dummy pixel circuit including at least one dummy transistor. A structure of the pixel circuit may be a same structure as a structure of the dummy pixel circuit.

The display panel may further include a pixel defining layer arranged on the pixel circuit and the dummy pixel circuit and including an opening corresponding to each of the plurality of pixels. The pixel defining layer may have a flat upper surface in correspondence with the dummy pixel.

The display panel may further include an organic emission layer arranged within the opening of the pixel defining layer in correspondence with the pixel. The organic emission layer may be arranged on an upper surface of the pixel defining layer in correspondence with the dummy pixel.

The display panel may further include a first common layer, an organic emission layer, and a second common layer sequentially stacked on each other and arranged within the opening of the pixel defining layer in correspondence with the pixel. The first common layer and the second common layer may contact each other on an upper surface of the pixel defining layer in correspondence with the dummy pixel.

The display panel may further include a pixel electrode connected to the pixel circuit, an intermediate layer arranged within the opening of the pixel defining layer, and an opposite electrode arranged on the intermediate layer, in correspondence with the pixel. The opening may expose the pixel electrode, and the opposite electrode may contact an upper surface of the pixel defining layer in correspondence with the dummy pixel.

The plurality of signal lines may include signal lines each extending in a first direction and being cut around the first region, and respective two cut portions of the cut signal lines may be connected to each other by connection lines that detour around the first region.

Some of the connection lines may be arranged on a same layer on which the signal lines are arranged, and the connection lines and the signal lines may be connected to each other by first bridge metals arranged on a different layer than a layer on which the connection lines and the signal lines are arranged.

Neighboring connection lines from among the connection lines may be arranged on different layers.

The display panel may further include a plurality of initializing voltage lines spaced apart from each other around the first region and the second region. The plurality of initializing voltage lines may be connected to each other via an initializing electrode layer in a ring shape that surrounds the first region and the second region.

The initializing electrode layer may be arranged on a different layer than a layer on which the plurality of initializing voltage lines are arranged, and may be connected to the plurality of initializing voltage lines via contact holes.

The plurality of signal lines may include scan lines each extending in a first direction and being cut around the first region, and scan connection lines each connecting two cut portions of each of the scan lines to each other; previous scan lines each extending in the first direction and being cut around the first region, and previous scan connection lines each connecting two cut portions of each of the previous scan lines to each other; and light-emission control lines each extending in the first direction and being cut around the first region, and light-emission control connection lines each connecting two cut portions of each of the light-emission control lines to each other. The scan connection lines, the previous scan connection lines, and the light-emission control connection lines may detour around the first region, and two lines neighboring each other from among the scan connection lines, the previous scan connection lines, and the light-emission control connection lines may be positioned on different layers.

The scan lines may include a first scan line connected to a first dummy pixel from among the plurality of dummy pixels. The previous scan lines may include a second previous scan line connected to a second dummy pixel adjacent to the first dummy pixel in a second direction that intersects with the first direction. The first scan line and the second previous scan line may be connected to one of the scan connection lines.

A second light-emission control line adjacent to a first light-emission control line from among the plurality of light-emission control lines may be connected to one of the light-emission control connection lines.

The dummy pixel may include a dummy pixel circuit. The dummy pixel circuit may include a switching thin-film transistor connected to one of the plurality of scan lines and one of a plurality of data lines; a driving thin-film transistor electrically connected to the switching thin-film transistor and from which a driving current corresponding to a data signal of the switching thin-film transistor flows; and a control thin-film transistor electrically connected to the driving thin-film transistor.

The dummy pixel circuit may further include a storage capacitor that overlaps the driving thin-film transistor.

The plurality of signal lines may include scan lines each extending in a first direction; and data lines each extending in a second direction intersecting with the first direction and each being cut around the first region. Respective two cut portions of the cut data lines may be connected to each other by data connection lines that detour around the first region.

Some of the data connection lines may be arranged on a same layer on which the data lines are arranged, and may be connected to each other via second bridge metals arranged on a different layer than a layer on which the data lines are arranged.

The data connection lines may include lower data connection lines arranged on a same layer on which the data lines are arranged, and upper data connection lines arranged on a different layer than the layer on which the data lines are arranged. The lower data connection lines and the upper data connection lines may alternate with each other.

BRIEF DESCRIPTION OF THE DRAWINGS

These and/or other aspects will become apparent and more readily appreciated from the following description of the embodiments, taken in conjunction with the accompanying drawings in which:

FIGS. 2A, 2B, and 2C are cross-sectional views of a display panel according to embodiments;

FIGS. 3A, 3B, and 3C are cross-sectional views of a display panel according to other embodiments;

DETAILED DESCRIPTION

Figure 1:
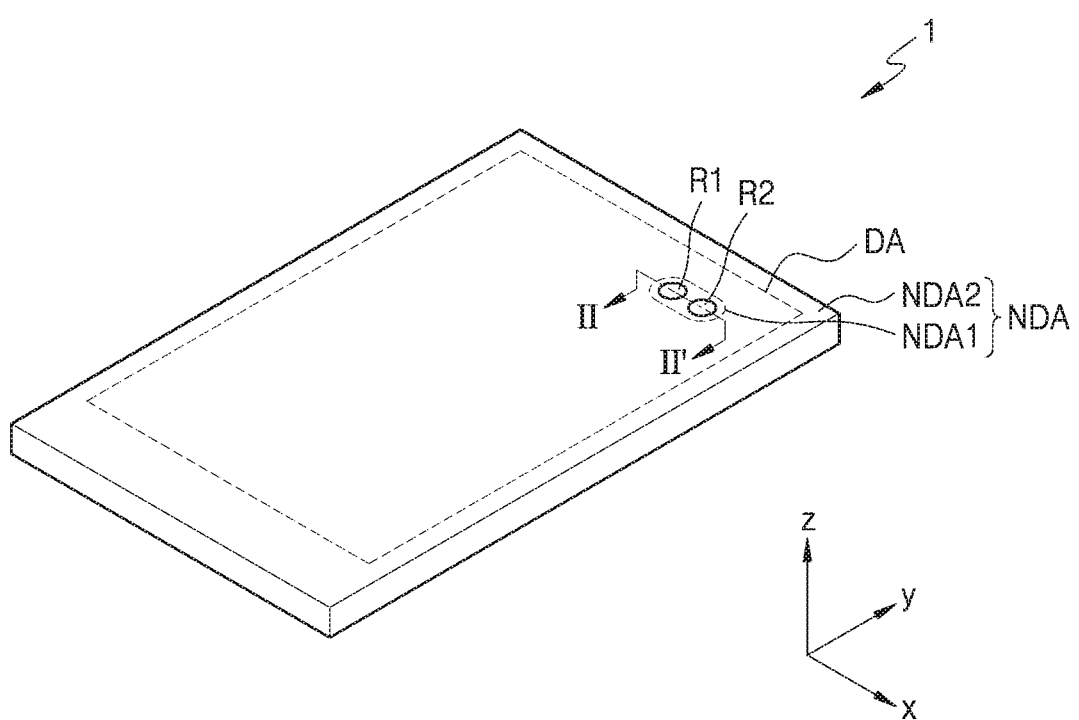
FIG. 1 is a schematic perspective view of a display device according to an embodiment.

As the disclosure allows for various changes and numerous embodiments, particular embodiments will be illustrated in the drawings and described in detail in the written description. Hereinafter, effects and features of the present disclosure and a method for accomplishing them will be described more fully with reference to the accompanying drawings, in which embodiments of the disclosure are shown. This disclosure may, however, be embodied in many different forms and should not be construed as limited to the embodiments set forth herein.

One or more embodiments of the disclosure will be described below in more detail with reference to the accompanying drawings. Those components that are the same or are in correspondence are rendered the same reference numeral regardless of the figure number, and redundant explanations are omitted.

It will be understood that although the terms "first", "second", etc. may be used herein to describe various components, these components should not be limited by these terms. These components are only used to distinguish one component from another.

As used herein, the singular forms "a", "an" and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components.

It will be understood that when a layer, region, or component is referred to as being "formed on" another layer, region, or component, it can be directly or indirectly formed on the other layer, region, or component. That is, for example, intervening layers, regions, or components may be present.

Sizes of elements in the drawings may be exaggerated for convenience of explanation. In other words, since sizes and thicknesses of components in the drawings are arbitrarily illustrated for convenience of explanation, the following embodiments are not limited thereto.

When a certain embodiment may be implemented differently, a specific process order may be performed differently from the described order. For example, two consecutively described processes may be performed substantially at the same time or performed in an order opposite to the described order.

It will also be understood that when a layer, region, or component is referred to as being "connected" or "coupled" to another layer, region, or component, it can be directly connected or coupled to the other layer, region, or component or intervening layers, regions, or components may be present. For example, when a layer, region, or component is referred to as being "electrically connected" or "electrically coupled" to another layer, region, or component, it can be directly electrically connected or coupled to the other layer, region, or component or intervening layers, regions, or components may be present.

FIG. 1 is a schematic plan view of a display device 1 according to an embodiment.

Referring to FIG. 1, the display device 1 includes a display area DA that emits light and a non-display area NDA that does not emit light.

The display device 1 may provide an image through the display area DA. The display device 1 may include a liquid crystal display (LCD), an electrophoretic display, an organic light-emitting display, an inorganic light-emitting display, a quantum-dot light emitting display, a field emission display, a surface-conduction electron-emitter display, a plasma display, or a cathode ray display.

Although an organic light-emitting display will now be illustrated and described as the display device 1 according to an embodiment, the disclosure is not limited thereto, and various types of display devices may be used.

The display device 1 includes a first region R1 and a second region R2. In the first region R1 and the second region R2, electronic elements are arranged as will be described later with reference to FIG. 2A and the like. The first and second regions R1 and R2 may be understood as opening areas or transmission areas capable of transmitting light or/and sound that is either output from the electronic elements to the outside or travels from the outside toward the electronic elements. Although opening areas or transmission areas are the first region R1 and the second region R2 in FIG. 1, the disclosure is not limited thereto, and three or more opening areas or transmission areas may be included.

According to an embodiment, when light passes through the first region R1 and the second region R2, light transmittance may be about 30% or greater, 50% or greater, 70% or greater, 80% or greater, or 85% or greater.

The non-display area NDA may include a first non-display area NDA1 surrounding the first and second regions R1 and R2, and a second non-display area NDA2 surrounding the display area DA. The first non-display area NDA1 may entirely surround the first and second regions R1 and R2, the display area DA may entirely surround the first non-display area NDA1, and the second non-display area NDA2 may entirely surround the display area DA.

Although the first and second regions R1 and R2 are on the upper right side of the display area DA in FIG. 1, the disclosure is not limited thereto. According to another embodiment, locations of the first region R1 and the second region R2 may vary.

Figure 2B:
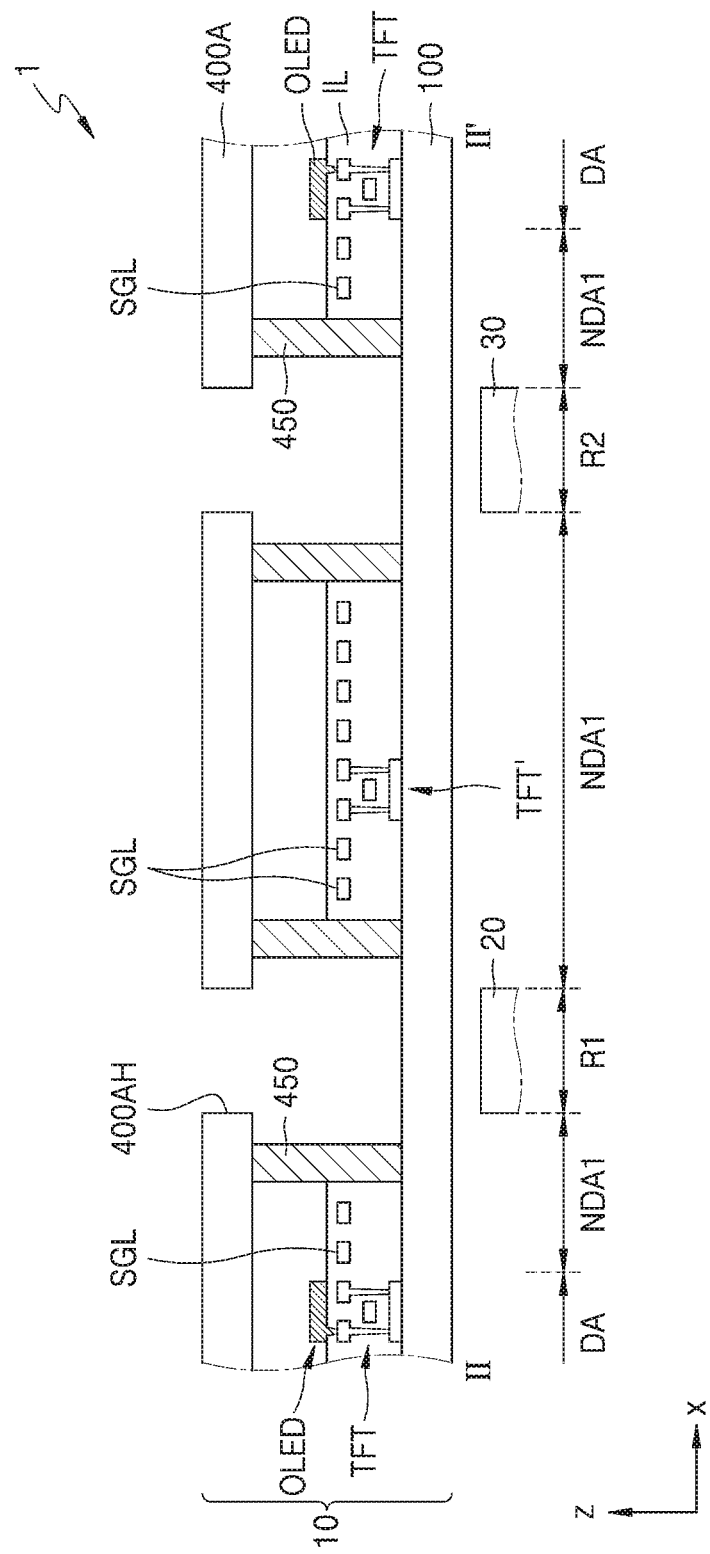
Figure 2C:
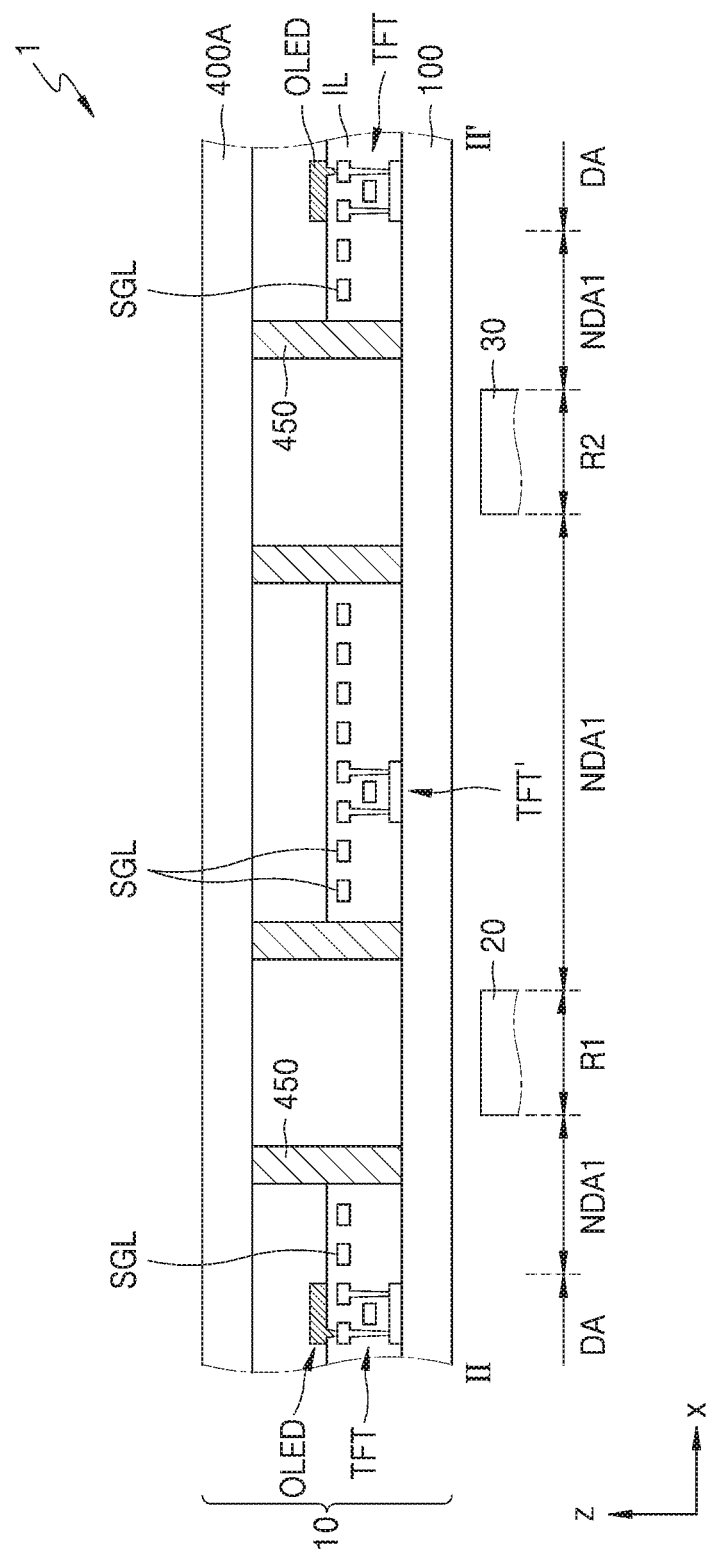

FIGS. 2A to 2C are schematic cross-sectional views of the display device 1 according to embodiments, and may correspond to cross-sections taken along line II-II' of FIG. 1.

Referring to FIG. 2A, the display device 1 may include a display panel 10 and first and second electronic elements 20 and 30 respectively corresponding to the first and second regions R1 and R2 of the display panel 10. Although not shown, a component(s), such as an input sensing member for sensing a touch input, an anti-reflection member including a polarizer and a retarder, a color filter and a black matrix, and a transparent window, may be arranged on the display panel 10.

The display panel 10 may include a substrate 100, an encapsulation substrate 400A as an encapsulation member that faces the substrate 100, and a sealing member 450 between the substrate 100 and the encapsulation substrate 400A.

The substrate 100 may include glass or polymer resin. Examples of the polymer resin may include polyethersulphone (PES), polyacrylate (PAR), polyetherimide (PEI), polyethylene naphthalate (PEN), polyethylene terephthalate (PET), polyphenylene sulfide (PPS), polyarylate, polyimide (PI), polycarbonate (PC), and cellulose acetate propionate (CAP). The substrate 100 including polymer resin may be flexible, rollable, and/or bendable. The substrate 100 may have a multi-layered structure including a layer including the aforementioned polymer resin and an inorganic layer (not shown). The encapsulation substrate 400A may include glass or the aforementioned polymer resin.

A thin-film transistor TFT, an organic light-emitting diode OLED as a display element connected to the thin-film transistor TFT, and signal lines SGL are arranged on the display area DA of the substrate 100. Signal lines SGL and a dummy thin-film transistor TFT' are arranged on the first non-display area NDA1 of the substrate 100.

Although not shown, signal lines SGL may provide a certain signal (e.g., a data signal and a scan signal) to display elements spaced apart from each other in a y direction (i.e., perpendicular to the x-z plane in FIG. 2A) about the first and second regions R1 and R2.

The display panel 10 may include through holes respectively corresponding to the first and second regions R1 and R2. For example, the substrate 100 and the encapsulation substrate 400A may include through holes 100H and through holes 400AH, respectively, wherein the through holes 100H correspond to the first and second regions R1 and R2 and the through holes 400AH correspond to the first and second regions R1 and R2, and portions of an insulating layer IL and/or other elements between the substrate 100 and the encapsulation substrate 400A, those portions corresponding to the first and second regions R1 and R2, may be removed.

FIG. 2A illustrates that sealing members 450 are arranged on both sides of the first and second regions R1 and R2, but, when viewed from a direction perpendicular to a main surface of the substrate 100, the first and second regions R1 and R2 may be understood as being entirely surrounded by the sealing members 450.

The first and second electronic elements 20 and 30 may be located in the first and second regions R1 and R2, respectively. The first and second electronic elements 20 and 30 may be electronic elements that use light or sounds. For example, an electronic element may be a sensor that receives and uses light, like an infrared sensor, a camera that receives light and captures an image, a sensor that outputs and senses light or sound to measure a distance or recognize a fingerprint or the like, a small lamp that outputs light, or a speaker that outputs sound. An electronic element using light may use light in various wavelength bands, such as visible light, infrared light, and ultraviolet light.

In the case where the display panel 10 includes through holes corresponding to the first and second regions R1 and R2, as in FIG. 2A, light or sounds output or received by the first and second electronic elements 20 and 30 may be more effectively utilized.

Unlike FIG. 2A in which the display panel 10 includes the through holes corresponding to the first and second regions R1 and R2, some elements of the display panel 10 may not include through holes. For example, as illustrated in FIG. 2B, the encapsulation substrate 400A may include the through holes 400AH corresponding to the first and second regions R1 and R2, but the substrate 100 may include no through holes. Alternatively, as illustrated in FIG. 2C, both the encapsulation substrate 400A and the substrate 100 may not include through holes corresponding to the first and second regions R1 and R2. As illustrated in FIGS. 2B and 2C, even though the substrate 100 does not include the through hole 100H, portions of the insulating layer IL and/or other elements between the substrate 100 and the encapsulation substrate 400A, those portions corresponding to the first and second regions R1 and R2, may be removed, and thus light transmittance of the first and second electronic elements 20 and 30 may be secured. When the display device 1 includes any of the display panels 10 of FIGS. 2B and 2C, the first and second electronic elements 20 and 30 may be electronic elements that use light.

Figure 3B:
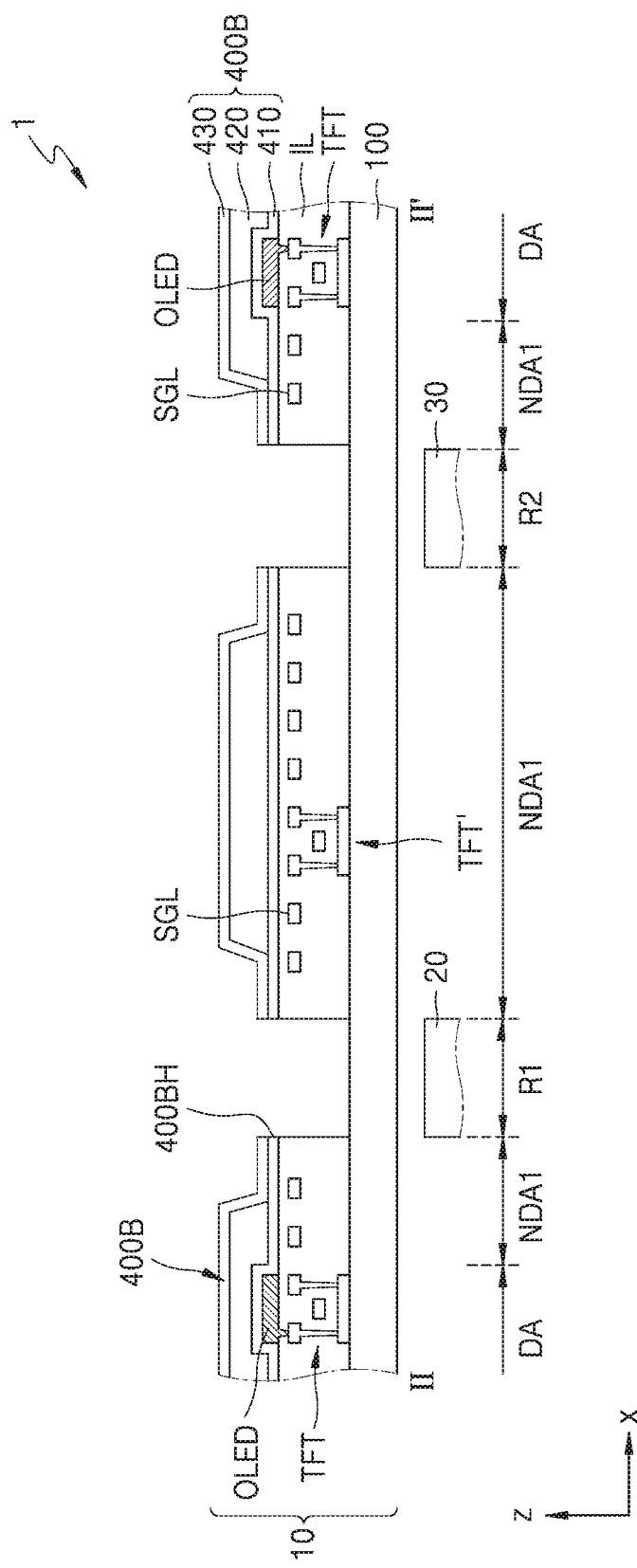
Figure 3C:
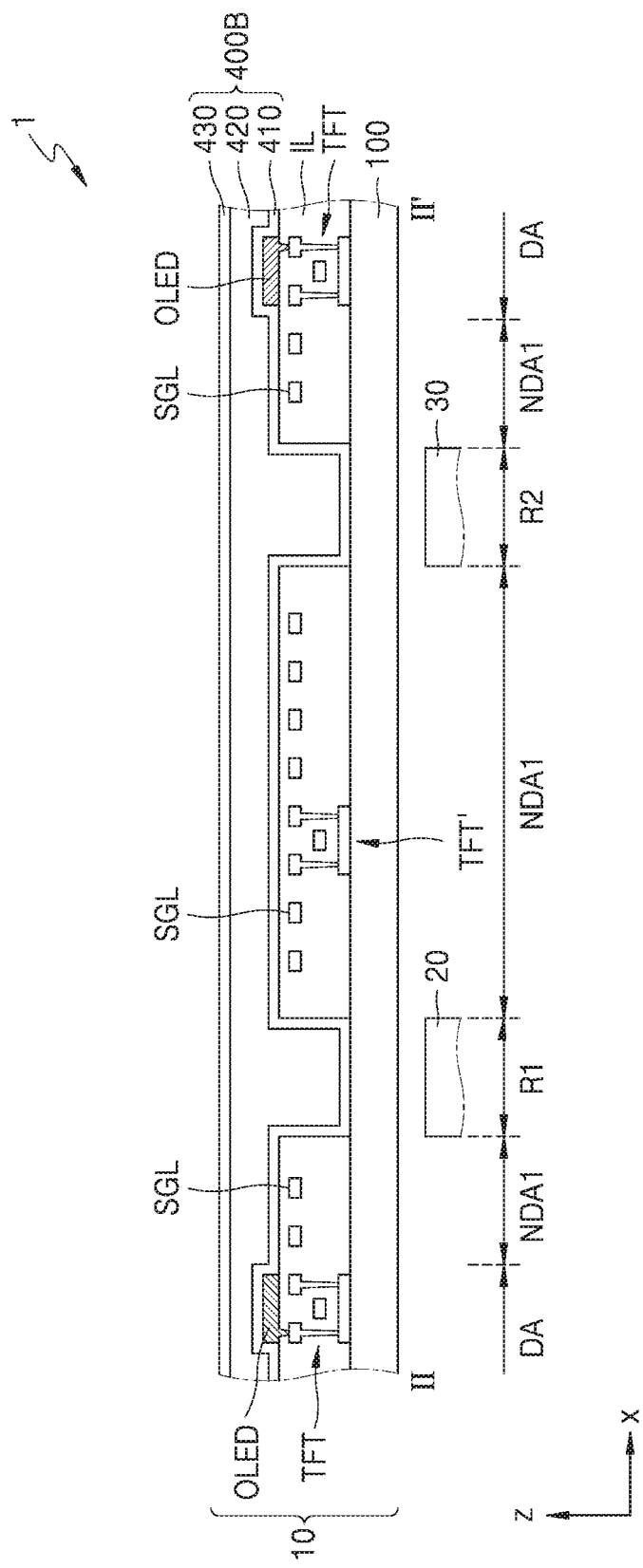

FIGS. 3A to 3C are schematic cross-sectional views of the display device 1 according to other embodiments, and may correspond to cross-sections taken along line II-II' of FIG. 1.

Similar to the display device 1 described above with reference to FIG. 2A, the display device 1 of FIG. 3A may include a display panel 10 including a display element, and first and second electronic elements 20 and 30 respectively corresponding to first and second regions R1 and R2 of the display panel 10. Although not shown, the display device 1 may further include an input detection member for sensing a touch input, a reflection prevention member, a window, and the like, arranged above the display panel 10.

Unlike the display panel 10 described above with reference to FIG. 2A that includes the encapsulation substrate 400A and the sealing members 450 as an encapsulation member, the display panel 10 according to the present embodiment may include a thin-film encapsulation layer 400B. In this case, the display panel 10 may have more improved flexibility. Differences therebetween will now be focused on and described.

The thin-film encapsulation layer 400B may include at least one inorganic encapsulation layer and at least one organic encapsulation layer. With regard to these layers, FIG. 3A illustrates first and second inorganic encapsulation layers 410 and 430 and an organic encapsulation layer 420 therebetween.

The first and second inorganic encapsulation layers 410 and 430 may include at least one inorganic insulating material, such as aluminum oxide, titanium oxide, tantalum oxide, hafnium oxide, zinc oxide, silicon oxide, silicon nitride, and silicon oxynitride. The organic encapsulation layer 420 may include a polymer-based material. Examples of the polymer-based material may include acrylic resin, epoxy resin, polyimide, and polyethylene.

The display panel 10 may include through holes corresponding to the first and second regions R1 and R2. For example, the substrate 100 and the thin-film encapsulation layer 400B may include through holes 100H corresponding to the first and second regions R1 and R2 and through holes 400BH corresponding to the first and second regions R1 and R2, respectively. As described above, the first and second electronic elements 20 and 30 using light or sound may be arranged in the first and second regions R1 and R2, respectively.

Unlike FIG. 3A in which the display panel 10 includes the through holes corresponding to the first and second regions R1 and R2, the display panel 10 may not include through holes. As illustrated in FIG. 3B, the thin-film encapsulation layer 400B may include the through holes 400BH corresponding to the first and second regions R1 and R2 but the substrate 100 may include no through holes. Alternatively, as illustrated in FIG. 3C, both the thin-film encapsulation layer 400B and the substrate 100 may not include through holes corresponding to the first and second regions R1 and R2. As illustrated in FIGS. 3B and 3C, even though the substrate 100 does not include the through holes 100H, portions of an insulating layer IL and/or other elements between the substrate 100 and the thin-film encapsulation layer 400B, those portions corresponding to the first and second regions R1 and R2, may be removed and thus light transmittance of the first and second electronic elements 20 and 30 may be secured.

When the thin-film encapsulation layer 400B includes the through holes 400BH as shown in FIGS. 3A and 3B, each of the at least one inorganic encapsulation layer and the at least one organic encapsulation layer may include holes corresponding to the through holes 400BH. In this case, the holes of each organic encapsulation layer are made larger than those of each inorganic encapsulation layer, and thus the first and second inorganic encapsulation layers 410 and 430 may directly contact each other around the first and second regions R1 and R2.

When the thin-film encapsulation layer 400B includes no through holes as shown in FIG. 3C, each of the at least one inorganic encapsulation layer and the at least one organic encapsulation layer may cover the first and second regions R1 and R2. In this case, the insulating layer IL between the substrate 100 and the thin-film encapsulation layer 400B may be removed. Although portions of the insulating layer IL that correspond to the first and second regions R1 and R2 are completely removed in the embodiment shown in FIG. 3A, only some of multiple layers that constitute the insulating layer IL may be removed in other embodiments.

Figure 4:
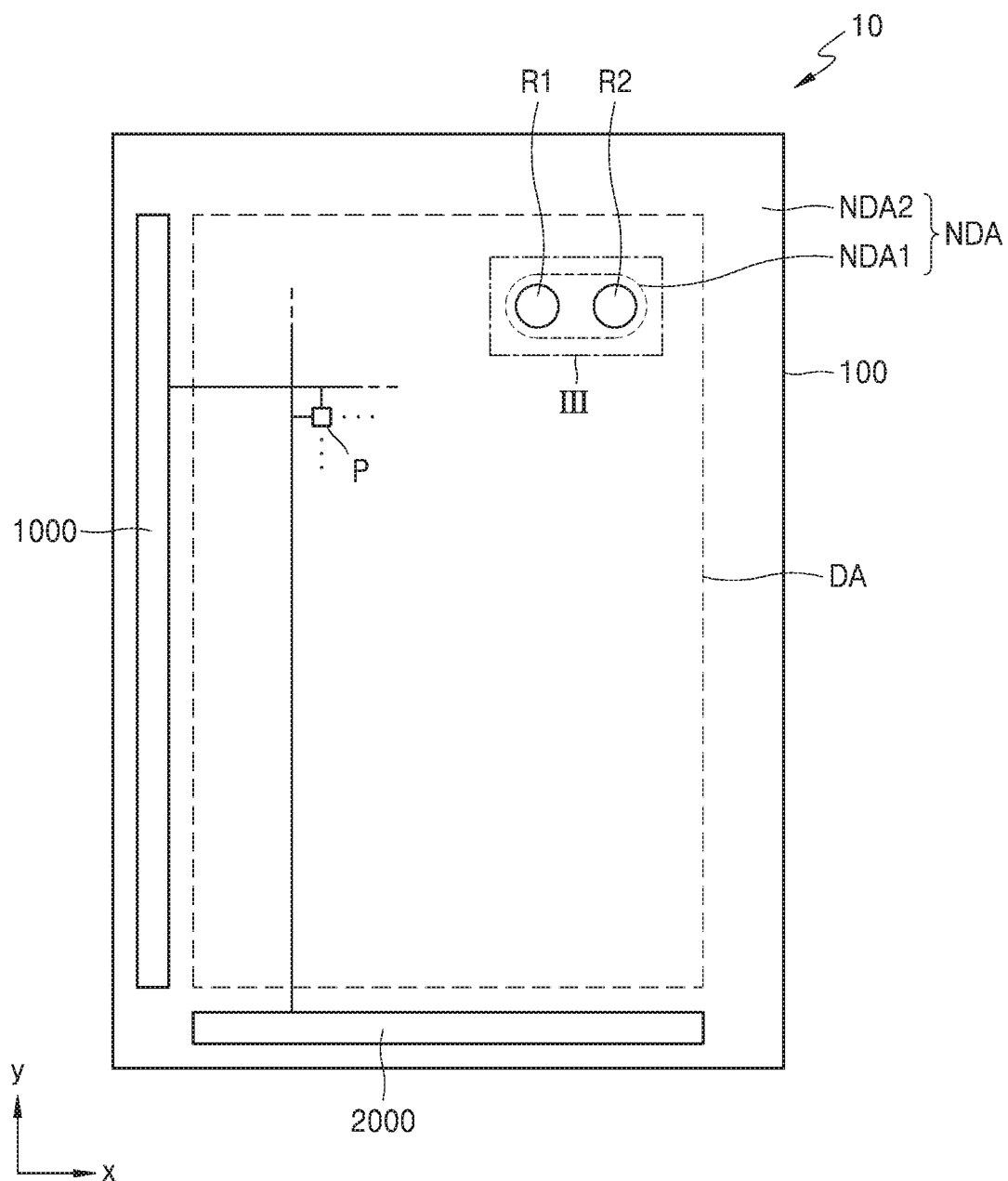
FIG. 4 is a schematic plan view of a display panel according to an embodiment.
Figure 5A:
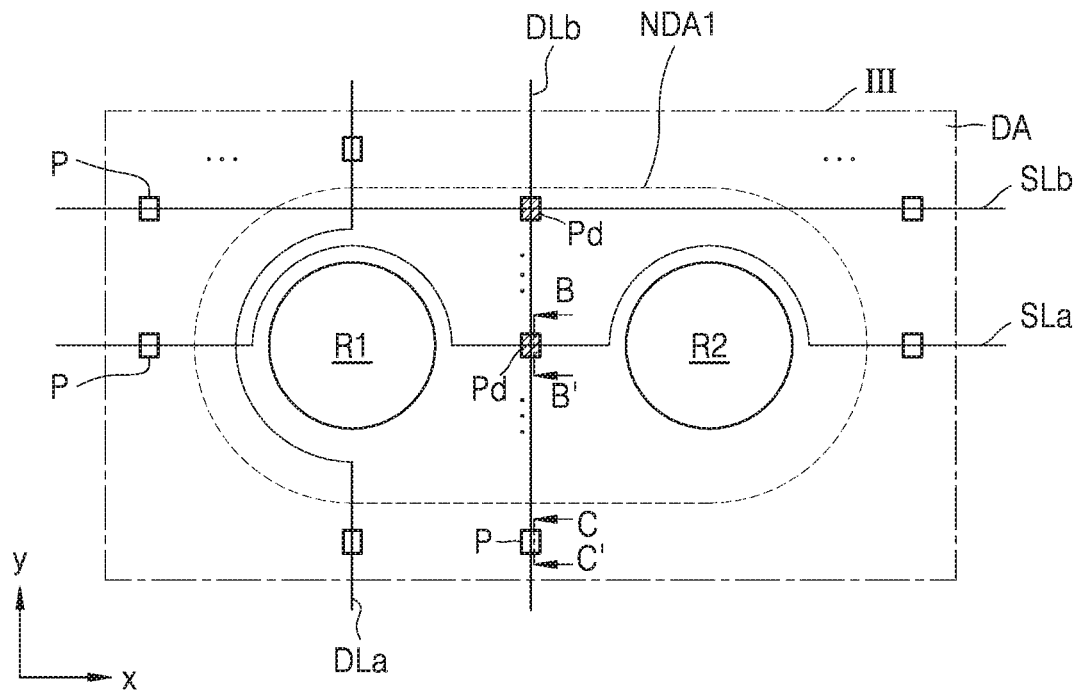
FIG. 5A is a magnified plan view of an embodiment of a region III of FIG. 4.
Figure 5B:
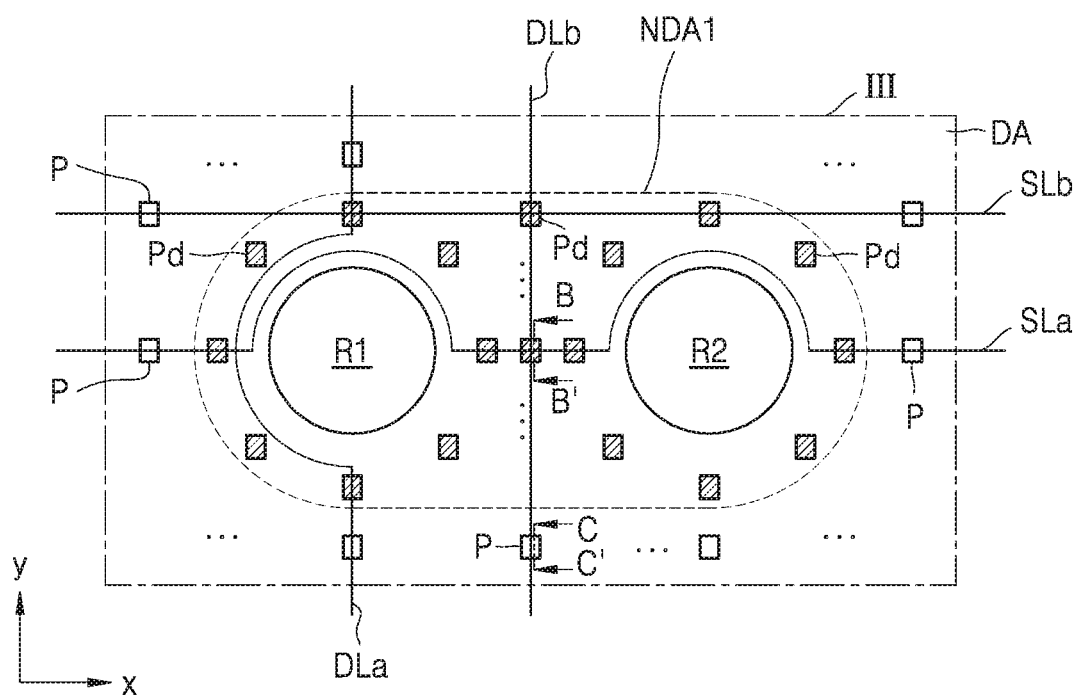
FIG. 5B is a magnified plan view of another embodiment of the region III of FIG. 4.

FIG. 4 is a schematic plan view of a display panel 10 according to an embodiment, and FIGS. 5A and 5B are plan views of a region III of FIG. 4.

Referring to FIG. 4, the display panel 10 includes a plurality of pixels P arranged in the display area DA. Each of the pixels P may include a display element, such as an organic light-emitting diode (OLED). The pixel PX may emit, for example, red light, green light, blue light, or white light via the OLED. The pixel PX used herein may be understood as a pixel that emits one of red light, green light, blue light, and white light as described above. The display area DA may be protected from external air or moisture by being covered by the encapsulation member described above with reference to FIGS. 2A to 3C.

The first non-display area NDA1 surrounds the first and second regions R1 and R2. The first non-display area NDA1 is an area in which no images are displayed. Signal lines that provide signals to the pixels P around the first and second regions R1 and R2 may be arranged in the first non-display area NDA1. According to the present embodiment, dummy pixels Pd that do not emit light are arranged in the first non-display area NDA1.

The second non-display area NDA2 may include a scan driver 1000 that provides scan signals to the pixels P and the dummy pixels Pd, a data driver 2000 that provides data signals to the pixels P and the dummy pixels Pd, and a main power line (not shown) for providing a driving voltage and a common voltage.

FIGS. 5A and 5B are magnified plan views of the region III of FIG. 4.

Referring to FIGS. 5A and 5B, the first region R1 and the second region R2 are arranged in a first direction, the first non-display area NDA1 surrounds the first region R1 and the second region R2, and the display area DA surrounds the first non-display area NDA1.

A plurality of pixels P are arranged in the display area DA, and a plurality of dummy pixels Pd are arranged in the first non-display area NDA1. A plurality of signal lines may be arranged to electrically connect the plurality of pixels P to the plurality of dummy pixels Pd. With regard to this, FIG. 5A illustrates that scan lines SLa and SLb each extending in the first direction (X direction) connect pixels P in the display area DA to dummy pixels Pd in the first non-display area NDA1 and data lines DLa and DLb connect pixels P to dummy pixels Pd in a second direction (Y direction) intersecting with the first direction.

Some scan lines SLa from among the scan lines SLa and SLb may each extend in the first direction (X direction) to provide signals to the pixels P positioned on the left and right sides of the first non-display area NDA1 and the dummy pixels Pd positioned in the first non-display area NDA1, but may detour around the first region R1 and the second region R2 in the first non-display area NDA1. Detouring around the respective region may refer to a portion of the line, which would have overlapped with the respective region had it extended in a straight line, instead being extended in a curve around the respective region such that it does not overlap with the respective region. For example, the portion of the line may be extended in a semicircle around the upper half of a respective region, with a curvature matching the respective region (i.e., the curvature of a circle) and having a larger radius; however, the shape is not limited thereto, and other shapes may be used, e.g., the curve may be only a partial instead of full semicircle, and/or the curve may not have a curvature matching that of a circle, and the like. Some scan lines SLb arranged far from the first region R1 and the second region R2 in the first non-display area NDA1 or scan lines that do not traverse the first non-display area NDA1 may each extend in a substantially straight line.

Some data lines DLa from among the data lines DLa and DLb may each extend in the second direction (Y direction) to provide signals to the pixels P arranged on the upper and lower sides of the first non-display area NDA1, but may detour around the first region R1 and/or the second region R2 in the first non-display area NDA1. Some data lines DLb arranged between the first region R1 and the second region R2 in the first non-display area NDA1 or data lines that do not traverse the first non-display area NDA1 may each extend in a substantially straight line.

For example, when the first region R1 and the second region R2 have circular shapes, signal lines positioned relatively close to the first region R1 and the second region R2 may be curved with large curvatures along the first region R1 and the second region R2, and signal lines positioned relatively far from the first region R1 and the second region R2 may each extend in a straight line.

According to the present embodiment, the dummy pixels Pd positioned in the first non-display area NDA1 may be included to emit no light even when they receive electrical signals from signal lines.

According to the present embodiment, the dummy pixels Pd may be included to secure uniformity of a pattern density and uniformity of an electrical load. In the case that no dummy pixels Pd are arranged in the first non-display area NDA1 and only signal lines SLa, SLb, DLa, and DLb connecting the pixels P in the display area DA to each other are arranged in the first non-display area NDA1, a pattern density is low in the first non-display area NDA1, and accordingly, a non-uniform pattern may be formed during etching.

Moreover, when no dummy pixels Pd are arranged in the first non-display area NDA1, a different parasitic capacitance or a different load may be formed in the first non-display area NDA1 and its surroundings from a center portion of the display area DA. Accordingly, brightness non-uniformity may occur.

According to the present embodiment, the first non-display area NDA1 includes a dummy pixel circuit having substantially the same structure as a pixel circuit PC (see FIGS. 7A and 7B) included in each pixel P, and an electrical signal is applied to the dummy pixel circuit, and thus uniformity of a pattern density and uniformity of an electrical load may be both secured.

The dummy pixels Pd may be positioned in the first non-display area NDA1 between the first region R1 and the second region R2. However, the disclosure is not limited thereto.

For example, as shown in FIG. 5B, dummy pixels Pd may be positioned to surround the first region R1 and/or the second region R2. In other words, dummy pixels Pd may not only be arranged between the first region R1 and the second region R2 but also on the right, upper, and lower sides of the first region R1 to be close to the display area DA. Dummy pixels Pd may also be arranged at locations on the right, upper, and lower sides of the second region R2, the locations close to the display area DA.

The dummy pixels Pd being arranged to surround the first region R1 and/or the second region R2 may mean the dummy pixels Pd being arranged between pixels P and the first region R1 and/or pixels P and the second region R2. Accordingly, the dummy pixels Pd may protect the pixels P in the display area DA from electrostatic discharge (ESD) that may occur around the first region R1 and/or the second region R2. In other words, when static electricity is generated around the first region R1 and/or the second region R2, the dummy pixels Pd may serve as a buffer to prevent a large voltage due to ESD from being transmitted to the pixels P.

Figure 6A:
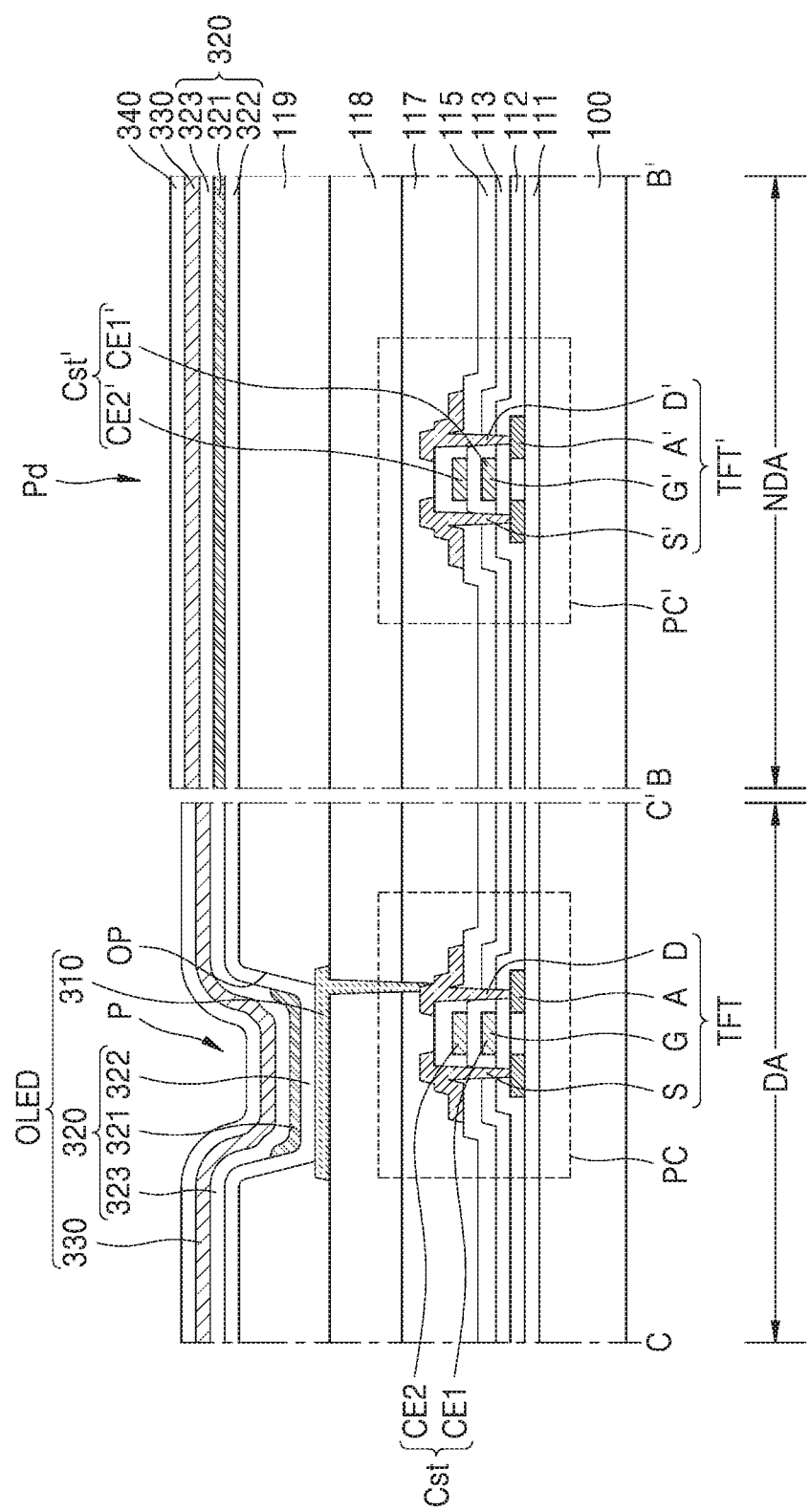
FIGS. 6A, 6B, 6C, and 6D are cross-sectional views of a pixel and a dummy pixel according to embodiments.
Figure 6B:
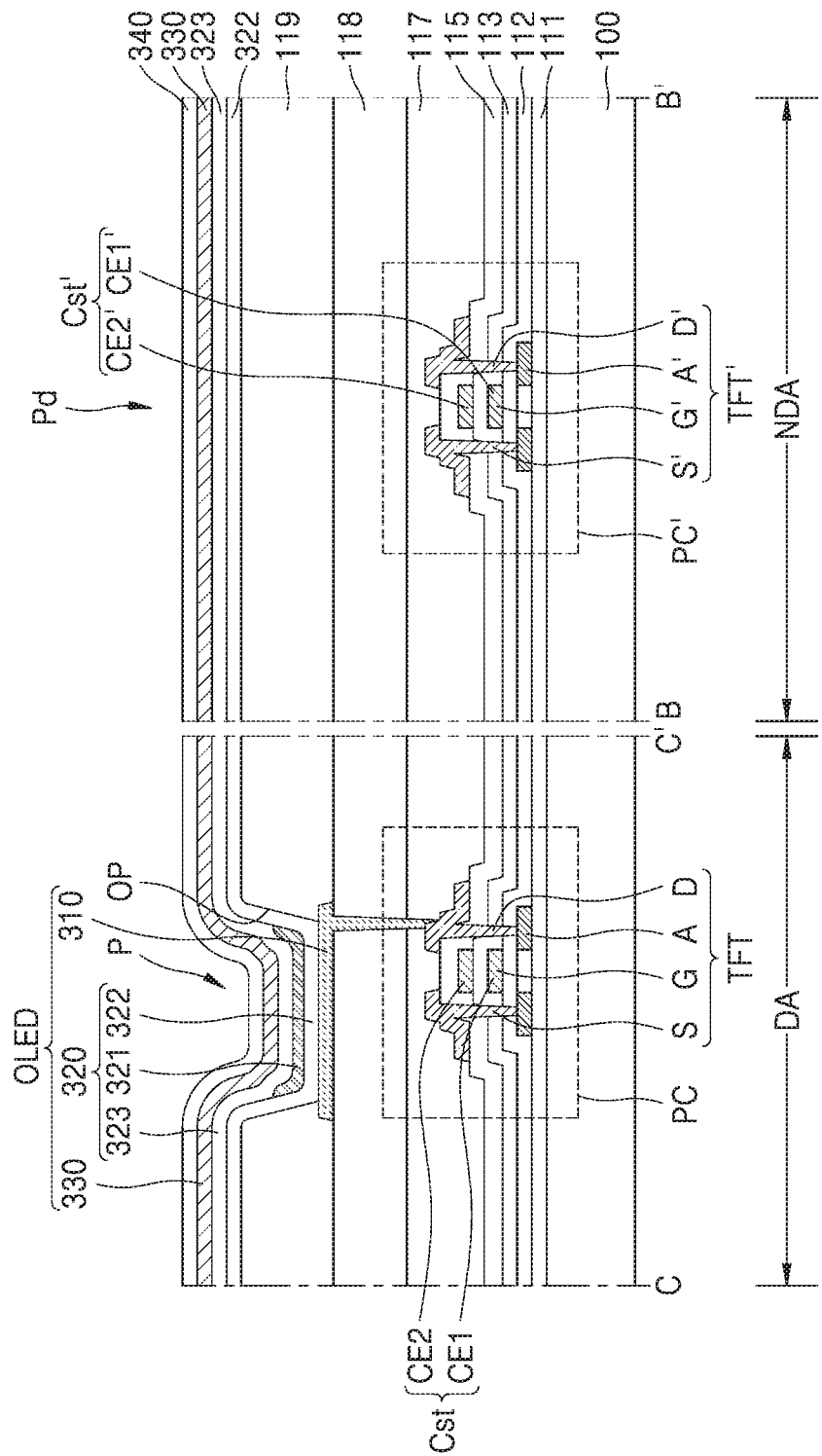
Figure 6C:
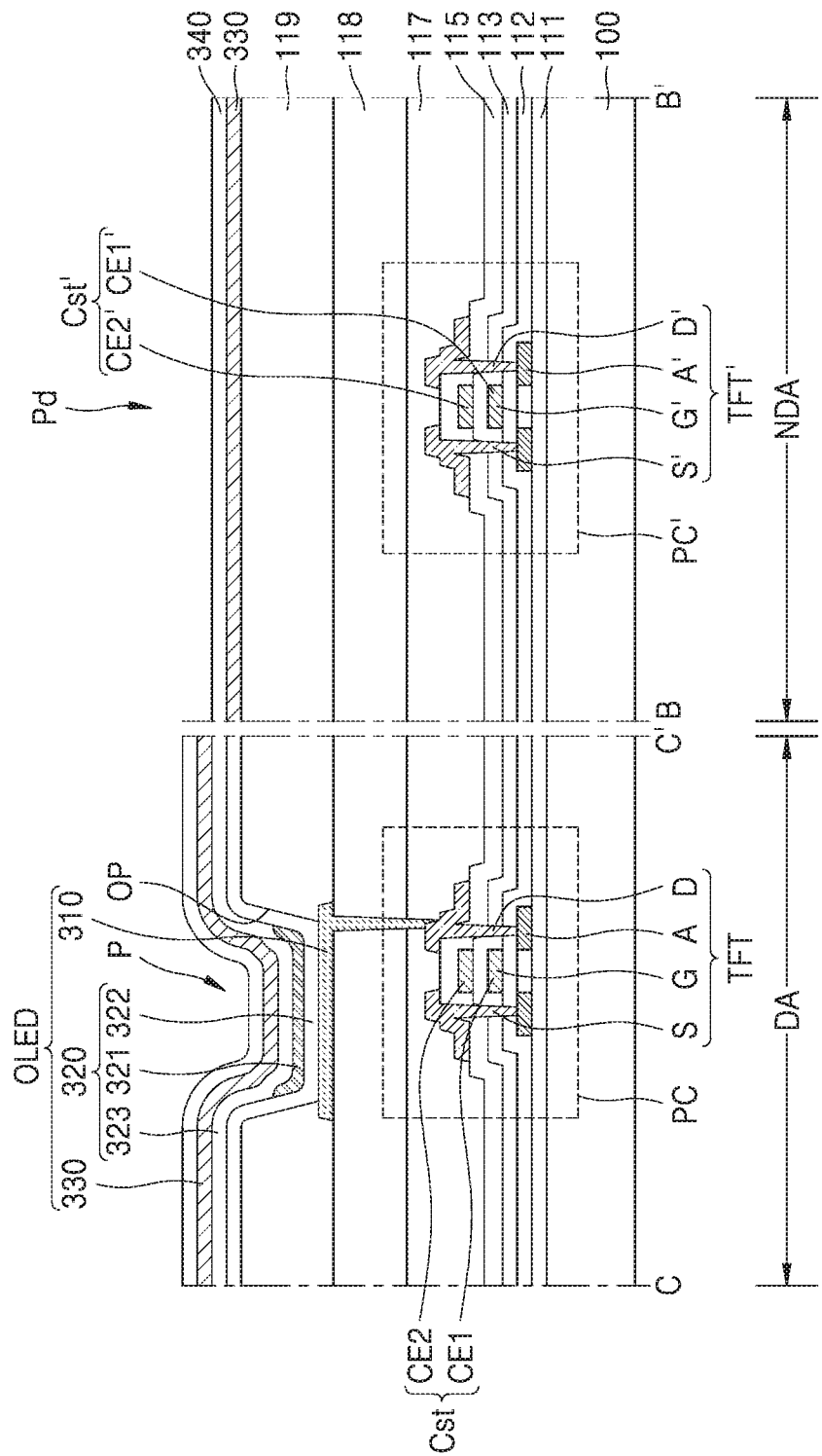
Figure 6D:
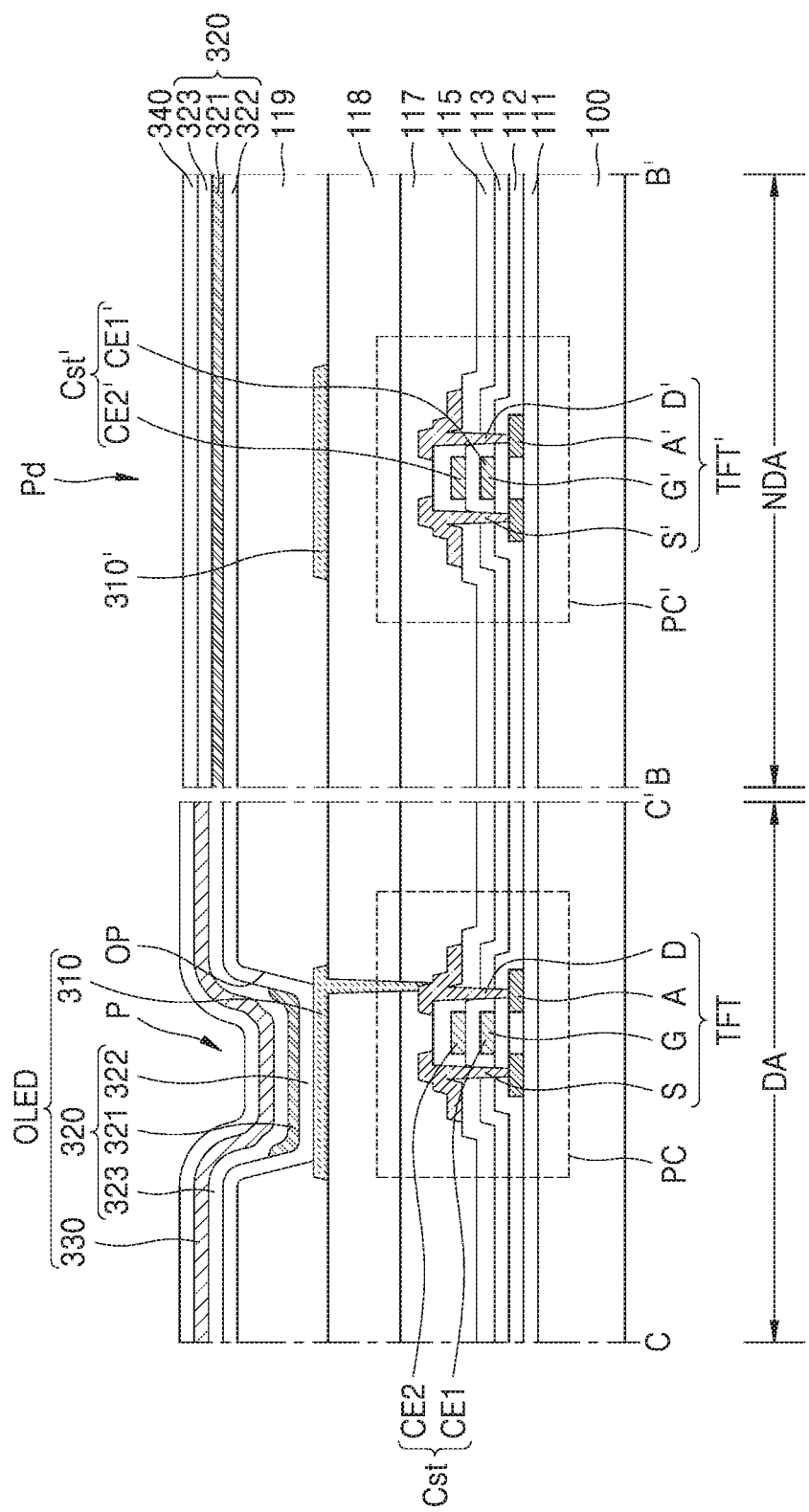

FIGS. 6A to 6C are schematic cross-sectional views of a pixel P and a dummy pixel Pd according to embodiments.

Referring to FIG. 6A, the pixel P may include a pixel circuit PC including at least one thin-film transistor TFT, and an organic light-emitting diode OLED as a display element. The dummy pixel Pd may include a dummy pixel circuit PC' including at least one dummy thin-film transistor TFT'. According to some embodiments, the pixel circuit PC and the dummy pixel circuit PC' may have the same structure. For example, the structure of the pixel circuit PC and the structure of the dummy pixel circuit PC' may have identical layers and elements arranged in identical order, all of the layers and elements having identical dimensions to each other.

In the dummy pixel Pd, some components of a display element are removed such that light is not emitted even when an electrical signal is applied to the dummy pixel circuit PC'.

According to the present embodiment, as compared with the pixel P, a pixel electrode 310 of the organic light-emitting diode OLED is not arranged in the dummy pixel Pd, and thus light is not emitted. However, the disclosure is not limited thereto. The dummy pixel Pd may not include an opposite electrode 330 of the organic light-emitting diode OLED. In this way, various modifications may be made.

Although a single thin-film transistor TFT is included in the pixel circuit PC and a single thin-film transistor TFT' is included in the dummy pixel circuit PC' in FIG. 6A, the disclosure is not limited thereto. A plurality of (two to seven) thin-film transistors TFT and a plurality of (two to seven) thin-film transistors TFT' may be included. In this way, various modifications may be made.

The structures of the pixel P and the dummy pixel Pd will now be described in a stacking order.

The substrate 100 may include a glass material, a metal material, or a material that is flexible or bendable. When the substrate 100 is flexible or bendable, the substrate 100 may include a polymer resin, such as polyethersulphone (PES), polyacrylate (PAR), polyetherimide (PEI), polyethylene naphthalate (PEN), polyethylene terephthalate (PET), polyphenylene sulfide (PPS), polyarylate, polyimide (PI), polycarbonate (PC), or cellulose acetate propionate (CAP). The substrate 100 may have a structure of a single layer or multiple layers of any of the aforementioned materials. The multi-layered structure may further include an inorganic layer. In some embodiments, the substrate 100 may have a structure of organic material/inorganic material/organic material.

A buffer layer 111 may be positioned on the substrate 100 and may reduce or prevent infiltration of a foreign material, moisture, or ambient air from below the substrate 100 and may provide a flat surface on the substrate 100. The buffer layer 111 may include an inorganic material (such as oxide or nitride), an organic material, or an organic and inorganic complex, and may be formed as a single layer or multiple layers of an inorganic material and an organic material.

A barrier layer (not shown) may be further included between the substrate 100 and the buffer layer 111. The barrier layer may prevent or minimize infiltration of impurities from the substrate 100 and the like into semiconductor layers A and A'. The barrier layer may include an inorganic material (such as oxide or nitride), an organic material, or an organic and inorganic complex, and may be formed as a single layer or multiple layers of an inorganic material and an organic material.

The semiconductor layers A and A' may be arranged on the buffer layer 111. The semiconductor layers A and A' may include amorphous silicon or polysilicon. According to another embodiment, the semiconductor layers A and A' may include oxide of at least one selected from the group consisting of indium (In), gallium (Ga), tin (Sn), zirconium (Zr), vanadium (V), hafnium (Hf), cadmium (Cd), germanium (Ge), chromium (Cr), titanium (Ti), aluminum (Al), cesium (Cs), cerium (Ce), and zinc (Zn). In some embodiments, the semiconductor layers A and A' may be formed of Zn oxide, In—Zn oxide, Ga—In—Zn oxide, or the like as a Zn oxide-based material. In other embodiments, the semiconductor layers A and A' may be an In—Ga—Zn—O (IGZO), In—Sn—Zn—O (ITZO), or In—Ga—Sn—Zn—O (IGTZO) semiconductor containing a metal, such as In, Ga, or Sn, in ZnO. The semiconductor layers A and A' may include a channel region, and a source region and a drain region respectively arranged on both sides of the channel region. Each of the semiconductor layers A and A' may be formed as a single layer or multiple layers.

Gate electrodes G and G' are arranged on the semiconductor layers A and A' with a first gate insulating layer 112 therebetween, such that the gate electrodes G and G' at least partially overlap the semiconductor layers A and A'. The gate electrodes G and G' may include, for example, molybdenum (Mo), aluminum (Al), copper (Cu), or titanium (Ti), and may each include a single layer or multiple layers. For example, each of the gate electrodes G and G' may include a single layer of Mo.

The first gate insulating layer 112 may include silicon oxide ($SiO_2$), silicon nitride (SiNx), silicon oxynitride (SiON), aluminum oxide ($Al_2O_3$), titanium oxide ($TiO_2$), tantalum oxide ($Ta_2O_5$), hafnium oxide ($HfO_2$), zinc oxide ($ZnO_2$), or the like.

A second gate insulating layer 113 may be included such that the second gate insulating layer 113 covers the gate electrodes G and G'. The second gate insulating layer 113 may include silicon oxide ($SiO_2$), silicon nitride (SiNx), silicon oxynitride (SiON), aluminum oxide ($Al_2O_3$), titanium oxide ($TiO_2$), tantalum oxide ($Ta_2O_5$), hafnium oxide ($HfO_2$), zinc oxide ($ZnO_2$), or the like.

First storage capacitor plates CE1 and CE1' of storage capacitors Cst and Cst' may overlap the thin-film transistors TFT and TFT'. For example, the gate electrodes G and G' of the thin-film transistors TFT and TFT' may function as the first storage capacitor plates CE1 and CE1' of the storage capacitors Cst and Cst'.

Second storage capacitor plates CE2 and CE2' of the storage capacitors Cst and Cst' overlap the first storage capacitor plates CE1 and CE1' with the second gate insulating layer 113 therebetween. In this case, the second gate insulating layer 113 may function as dielectric layers of the storage capacitors Cst and Cst'. The second storage capacitor plates CE2 and CE2' may include a conductive material including molybdenum (Mo), aluminum (Al), copper (Cu), and titanium (Ti), and may each be formed as a multi-layer or single layer including the aforementioned materials. For example, the second storage capacitor plates CE2 and CE2' may each be a single layer of Mo or a multi-layer of Mo/Al/Mo.

Although the storage capacitors Cst and Cst' overlap the thin-film transistors TFT and TFT' in FIGS. 6A to 6D, the disclosure is not limited thereto. The storage capacitors Cst and Cst' may not overlap the thin-film transistors TFT and TFT'. In this way, various modifications may be made.

An interlayer insulating layer 115 may be included to cover the second storage capacitor plates CE2 and CE2' of the storage capacitors Cst and Cst'. The interlayer insulating layer 115 may include silicon oxide ($SiO_2$), silicon nitride (SiNx), silicon oxynitride (SiON), aluminum oxide ($Al_2O_3$), titanium oxide ($TiO_2$), tantalum oxide ($Ta_2O_5$), hafnium oxide ($HfO_2$), zinc oxide ($ZnO_2$), or the like.

Source electrodes S and S' and drain electrodes D and D' may be arranged on the interlayer insulating layer 115. Each of the source electrode S and S' and the drain electrodes D and D' may include a conductive material including Mo, Al, Cu, and Ti, and may be a multi-layer or single layer including the aforementioned materials. For example, each of the source electrodes S and S' and the drain electrodes D and D' may be a multi-layer of Ti/Al/Ti.

A via layer 117 and an additional via layer 118 may be positioned on the source electrodes S and S' and the drain electrodes D and D', and the organic light-emitting diode OLED may be positioned in a region of the pixel P on the additional via layer 118. In some embodiments, the additional via layer 118 may be omitted.

The via layer 117 and the additional via layer 118 may have flat upper surfaces such that the first electrode 310 may be formed flat. The via layer 117 and the additional via layer 118 may each be formed as a single layer including an organic material or as multiple layers each including an organic material. The via layer 117 and the additional via layer 118 may include a commercial polymer such as benzocyclobutene (BCB), polyimide, hexamethyldisiloxane (HMDSO), polymethyl methacrylate (PMMA) or polystyrene (PS), a polymer derivative having a phenol-based group, an acryl-based polymer, an imide-based polymer, an acryl ether-based polymer, an amide-based polymer, a fluorine-based polymer, a p-xylene-based polymer, a vinyl alcohol-based polymer, a blend thereof, or the like. The via layer 117 and the additional via layer 118 may include an inorganic material. The via layer 117 and the additional via layer 118 may include silicon oxide ($SiO_2$), silicon nitride (SiNx), silicon oxynitride (SiON), aluminum oxide ($Al_2O_3$), titanium oxide ($TiO_2$), tantalum oxide ($Ta_2O_5$), hafnium oxide ($HfO_2$), zinc oxide ($ZnO_2$), or the like. When the via layer 117 and the additional via layer 118 include an inorganic material, chemical planarization polishing may be conducted. The via layer 117 may include both an organic material and an inorganic material.

In the display area DA of the substrate 100, the organic light-emitting diode OLED is positioned on the additional via layer 118. The organic light-emitting diode OLED includes the pixel electrode 310, the opposite electrode 330, and an intermediate layer 320 including an organic emission layer.

A via hole via which one of the source electrode S and the drain electrode D of the thin-film transistor TFT is exposed is formed in the via layer 117 and the additional via layer 118, and the pixel electrode 310 contacts the source electrode S or the drain electrode D via the via hole and is electrically connected to the thin-film transistor TFT.

The pixel electrode 310 may include a (semi)light-transmissive electrode or a reflective electrode. According to some embodiments, the pixel electrode 310 may include a reflection layer formed of silver (Ag), magnesium (Mg), aluminum (Al), platinum (Pt), palladium (Pd), gold (Au), nickel (Ni), neodymium (Nd), iridium (Ir), chromium (Cr), or a compound thereof, and a transparent or semi-transparent electrode layer formed on the reflection layer. The transparent or semi-transparent electrode layer may include at least one selected from the group consisting of indium tin oxide (ITO), indium zinc oxide (IZO), zinc oxide (ZnO), indium oxide ($In_2O_3$), indium gallium oxide (IGO), and aluminum zinc oxide (AZO). According to some embodiments, the pixel electrode 310 may have a stack structure of ITO/Ag/ITO.

A pixel defining layer 119 may be disposed on the additional via layer 118. The pixel defining layer 119 may define light-emission regions of pixels P by including openings respectively corresponding to the pixel electrodes 310, namely, openings OP via which at least center portions of the pixel electrodes 310 are exposed, in the display area DA. The pixel defining layer 119 may prevent an arc or the like from occurring on the edges of the pixel electrodes 310 by increasing distances between the edges of the pixel electrodes 310 and the opposite electrodes 330 disposed over the pixel electrodes 310. The pixel defining layer 119 may be formed of an organic insulating material, such as polyimide, polyamide, acryl resin, benzocyclobutene, hexamethyldisiloxane (HMDSO), or phenol resin, via spin coating or the like.

The pixels P, namely, the light-emission regions of the pixels P, may be defined by the openings OP of the pixel defining layer 119. In other words, the edges of the pixels P may mean edges of the openings OP of the pixel defining layer 119. The edges of the openings OP of the pixel defining layer 119 may mean boundaries of the pixel electrodes 310 that are exposed via the openings OP.

The intermediate layer 320 of the organic light-emitting diode OLED may include an organic emission layer 321, and a first common layer 322 and a second common layer 323 that may be respectively disposed on the bottom and top of the organic emission layer 321.

The organic emission layer 321 may include an organic material including a fluorescent or phosphorescent material that emits red, green, blue, or white light. The organic emission layer 321 may include a low-molecular weight organic material or a high-molecular weight organic material.

The first common layer 322 may include a hole injection layer (HIL) and/or a hole transport layer (HTL), and the second common layer 323 may include an electron transport layer (ETL) and/or an electron injection layer (EIL).

The intermediate layer 320 may be arranged to correspond to each of a plurality of first electrodes 310. However, the disclosure is not limited thereto. The intermediate layer 320 may include a single layer extending over the plurality of first electrodes 310, namely, the first common layer 322 and/or the second common layer 323. In this way, various modifications may be made. The first common layer 322 and/or the second common layer 323 may be omitted.

The opposite electrode 330 may include a light-transmissive electrode or a reflective electrode. According to some embodiments, the opposite electrode 330 may include a transparent or semi-transparent electrode, and may include a metal thin film having a small work function, including lithium (Li), calcium (Ca), lithium fluoride/calcium (LiF/Ca), lithium fluoride/aluminum (LiF/Al), aluminum (Al), silver (Ag), magnesium (Mg), or a compound thereof. A transparent conductive oxide (TCO) layer including TCO, such as indium tin oxide (ITO), indium zinc oxide (IZO), zinc oxide (ZnO), or indium oxide ($In_2O_3$), may be further disposed on the metal thin film. The opposite electrode 330 may extend over the display area DA and the non-display area NDA, and may be arranged on the intermediate layer 320 and the pixel defining layer 119. The opposite electrode 330 may be formed as a single body constituting a plurality of organic light-emitting diodes OLED, and thus may correspond to the plurality of pixel electrodes 310.

When the pixel electrode 310 includes a reflective electrode and the opposite electrode 330 includes a light-transmissive electrode, light emitted by the intermediate layer 320 is emitted toward the opposite electrode 330, and accordingly the display device 1 may be of a top-emission type. When the pixel electrode 310 includes a transparent or semi-transparent electrode and the opposite electrode 330 includes a reflective electrode, light emitted by the intermediate layer 320 is emitted toward the substrate 100, and accordingly the display device 1 may be of a bottom-emission type. However, the present embodiment is not limited thereto. The display device 1 according to the present embodiment may be of a dual emission type that emits light in both directions, namely, toward the top surface and the bottom surface of the display device 1.

The dummy pixel Pd arranged in the first non-display area NDA1 of the substrate 100 may include no pixel electrodes, unlike the pixel P, and the pixel defining layer 119 may not include an opening corresponding to the dummy pixel Pd. In other words, the pixel defining layer 119 may have a flat upper surface in correspondence with the dummy pixel Pd, because the pixel defining layer 119 may be formed of an organic material via exposure and curing and may not affect non-uniformity due to a pattern density.

In the region of the dummy pixel Pd, the intermediate layer 320 may be positioned on the pixel defining layer 119. Even when the intermediate layer 320 is arranged in the region of the dummy pixel Pd, the dummy pixel Pd includes no pixel electrodes, and thus light is not emitted by the intermediate layer 320.

In FIG. 6A, the organic emission layer 321, the first common layer 322, and the second common layer 323 are all arranged in the region of the dummy pixel Pd, like the intermediate layer 320 arranged in the pixel P. However, the disclosure is not limited thereto.

As in FIG. 6B, the organic emission layer 321, the first common layer 322, and the second common layer 323 may be arranged in the region of the pixel P, and, in the region of the dummy pixel Pd, no organic emission layers 321 may be arranged, and only the first common layer 322 and the second common layer 323 may be arranged. In this case, the first and second common electrodes 322 and 323 may directly contact each other in the region of the dummy pixel Pd.

Alternatively, as in FIG. 6C, the intermediate layer 320 may be arranged in the region of the pixel P and no intermediate layer 320 may be arranged in the region of the dummy pixel Pd. In this way, various modifications may be made. In this case, the opposite electrodes 330 may directly contact an upper surface of the pixel defining layer 119 in the region of the dummy pixel Pd.

Although the opposite electrode 330 is arranged not only in the region of the pixel P but also in the region of the dummy pixel Pd in FIGS. 6A through 6C, the disclosure is not limited thereto. For example, as in FIG. 6D, the opposite electrode 330 may not be arranged in the dummy pixel Pd. In this case, as in FIG. 6D, a conductive layer 310' including the same material as that included in the pixel electrode 310 and positioned on the same layer on which the pixel electrode 310 is formed, and the organic emission layer 321, the first common layer 322, and the second common layer 323 of the intermediate layer 320 may be arranged in the dummy pixel Pd. However, the disclosure is not limited thereto. At least one of the conductive layer 310', the organic emission layer 321, the first common layer 322, and the second common layer 323 may be omitted.

Because the opposite electrode 330 is formed over the entire display panel by using an open mask, the opposite electrode 330 may be arranged to correspond to the pixel P and the dummy pixel Pd during a process.

A capping layer 340 may be arranged on the opposite electrode 330. The capping layer 340 may have a different (lower or higher) refractive index than the opposite electrode 330 and may improve luminescent efficiency by increasing a percentage that light generated by the intermediate layer 320 including the organic emission layer 321 is emitted to the outside.

For example, the capping layer 340 may include an organic material, such as poly(3,4-ethylenedioxythiophene) (or PEDOT), 4,4'-bis [N-(3-methylphenyl)-N-phenylamino] biphenyl (TPD), 4,4',4"-tris [(3-methylphenyl) phenylamino] triphenylamine (m-MTDATA), 1,3,5-tris [N,N-bis(2-methylphenyl)-amino]-benzene (o-MTDAB), 1,3,5-tris [N,N-bis (3-methylphenyl)-amino]-benzene (m-MTDAT), 1,3,5-tris [N,N-bis (4-methylphenyl)-amino]-benzene (p-MTDAB), 4,4'-bis [N, N-bis (3-methylphenyl)-amino]-diphenylmethane (BPPM), 4,4'-dicarbazolyl-1,1'-biphenyl (CBP), 4,4',4"-tris (N-carbazole) triphenylamine (TCTA), 2,2',2"-(1,3,5-benzenetolyl) tris-[1-phenyl-1H-benzoimidazole] (TPBI), and 3-(4-biphenyl)-4-phenyl-5-t-butylphenyl-1,2,4-triazole (TAZ).

Alternatively, the capping layer 340 may include an inorganic material, such as zinc oxide, titanium oxide, zirconium oxide, silicon nitride, niobium oxide, tantalum oxide, tin oxide, nickel oxide, indium nitride, and gallium nitride. The materials of the capping layer 340 are not limited thereto, and various other materials may be used.

A cover layer (not shown) may be arranged on the capping layer 340. The cover layer protects the organic light-emitting diode OLED against damage that may occur during a subsequent process using plasma or the like. The cover layer may include LiF.

Figure 7A:
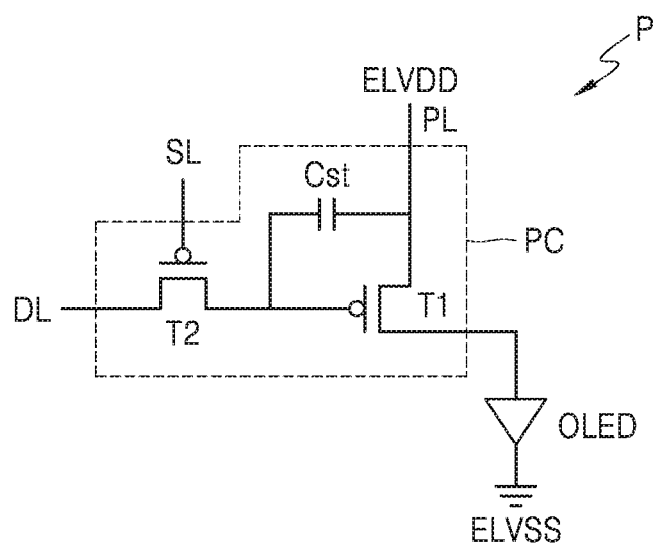
FIGS. 7A and 7B are equivalent circuit diagrams of a pixel according to embodiments.
Figure 7B:
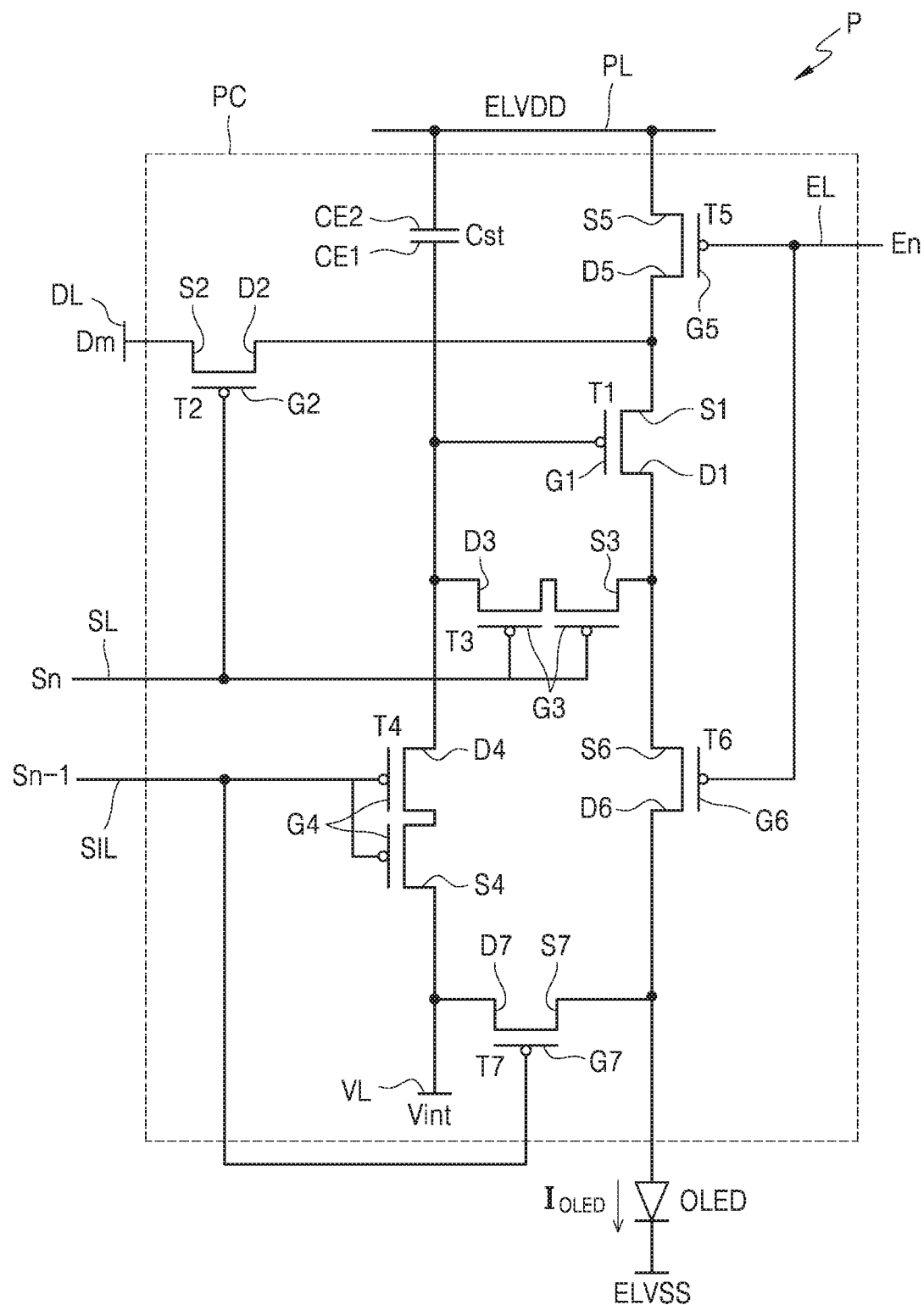

FIGS. 7A and 7B are schematic equivalent circuit diagrams of a pixel P of a display panel according to embodiments.

Referring to FIG. 7A, each pixel P includes a pixel circuit PC and an organic light-emitting diode OLED connected to the pixel circuit PC. The pixel circuit PC may include a driving thin-film transistor (TFT) T1, a switching TFT T2, and a storage capacitor Cst.

The switching TFT T2 is connected to a scan line SL and a data line DL, and transmits, to the driving TFT T1, a data voltage received via the data line DL according to a switching voltage received via the scan line SL. The storage capacitor Cst is connected to the switching TFT T2 and a driving voltage line PL, and stores a voltage corresponding to a difference between a voltage received from the switching TFT T2 and a driving voltage ELVDD supplied to the driving voltage line PL.

The driving TFT T1 is connected to the driving voltage line PL and the storage capacitor Cst, and may control a driving current flowing from the driving voltage line PL to the organic light-emitting diode OLED, in accordance with a voltage value stored in the storage capacitor Cst. The organic light-emitting diode OLED may emit light having a certain brightness by the driving current. An opposite electrode (for example, a cathode) of the organic light-emitting diode OLED may receive a common voltage ELVSS.

Although a case where the pixel circuit PC includes two TFTs and one storage capacitor is illustrated in FIG. 7A, the disclosure is not limited thereto. The number of TFTs and the number of storage capacitors may vary according to a design of the pixel circuit PC.

Referring to FIG. 7B, the pixel circuit PC may include a plurality of TFTs and a storage capacitor Cst. The TFTs and the storage capacitor may be connected to signal lines SL, SIL, EL, and DL, an initializing voltage line VL, and a driving voltage line PL.

Although each pixel P is connected to the signal lines SL, SIL, EL, and DL, the initializing voltage line VL, and the driving voltage line PL in FIG. 7B, the disclosure is not limited thereto. According to another embodiment, the initializing voltage line VL, the driving voltage line PL, and at least one of the signal lines SL, SIL, EL, and DL may be shared by neighboring pixels.

The plurality of TFTs may include a driving TFT T1, a switching TFT T2, a compensating TFT T3, a first initializing TFT T4, an operation control TFT T5, a light-emission control TFT T6, and a second initializing TFT T7.

The signal lines SL, SIL, EL, and DL may include a scan line SL that transmits a scan signal SL, a previous scan line SIL that transmits a previous scan signal Sn-1 to the second initializing TFT T7, a light-emission control line EL that transmits a light-emission control signal En to the operation control TFT T5 and the light-emission control TFT T6, and a data line DL that intersects with the scan line SL and transmits a data signal Dm. The driving voltage line PL transmits a driving voltage ELVDD to the driving TFT T1, and the initializing voltage line VL transmits an initializing voltage Vint that initiates the driving TFT T1 and a pixel electrode of the organic light-emitting diode OLED.

The driving TFT T1 includes a driving gate electrode G1 connected to a first storage capacitor plate CE1 of the storage capacitor Cst, a driving source electrode S1 connected to the driving voltage line PL via the operation control TFT T5, and a driving drain electrode D1 electrically connected to the pixel electrode of the organic light-emitting diode OLED via the light-emission control TFT T6. The driving TFT T1 receives the data signal Dm according to a switching operation of the switching TFT T2 and supplies a driving current IDLED to the organic light-emitting diode OLED.

The switching TFT T2 includes a switching gate electrode G2 connected to the scan line SL, a switching source electrode S2 connected to the data line DL, and a switching drain electrode D2 connected to the driving source electrode S1 of the driving TFT T1 and also connected to the driving voltage line PL via the operation control TFT T5. The switching TFT T2 is turned on according to the scan signal GW received via the scan line SL and performs a switching operation of transmitting the data signal Dm received from the data line DL to the driving source electrode S1 of the driving TFT T1.

The compensating TFT T3 includes a compensating gate electrode G3 connected to the scan line SL, a compensating source electrode S3 connected to the driving drain electrode D1 of the driving TFT T1 and also connected to the pixel electrode of the organic light-emitting diode OLED via the light-emission control TFT T6, and a compensating drain electrode D3 connected to the first storage capacitor plate CE1 of the storage capacitor Cst, a first initializing drain electrode D4 of the first initializing TFT T4, and the driving gate electrode G1 of the driving TFT T1. The compensating TFT T3 is turned on according to the scan signal GW received via the scan line SL and electrically connects the driving gate electrode S1 and the driving drain electrode D1 of the driving TFT T1 to each other, such that the driving TFT T1 is diode-connected.

The first initializing TFT T4 includes a first initializing gate electrode G4 connected to the previous scan line SIL, a first initializing source electrode S4 connected to a second initializing drain electrode D7 of the second initializing TFT T7 and the initializing voltage line VL, and the first initializing drain electrode D4 connected to the first storage capacitor plate CE1 of the storage capacitor Cst, the compensating drain electrode D3 of the compensating TFT T3, and the driving gate electrode G1 of the driving TFT T1. The first initializing TFT T4 is turned on according to the previous scan signal Sn-1 received via the previous scan line SIL and transmits the initializing voltage Vint to the driving gate electrode G1 of the driving TFT T1 to thereby initialize a voltage of the driving gate electrode G1 of the driving TFT T1.

The operation control TFT T5 includes an operation control gate electrode G5 connected to the light-emission control line EL, an operation control source electrode S5 connected to the driving voltage line PL, and an operation control drain electrode D5 connected to the driving source electrode S1 of the driving TFT T1 and the switching drain electrode D2 of the switching TFT T2.

The light-emission control TFT T6 includes a light-emission control gate electrode G6 connected to the light-emission control line EL, a light-emission control source electrode S6 connected to the driving drain electrode D1 of the driving TFT T1 and the compensating source electrode S3 of the compensating TFT T3, and a light-emission control drain electrode D6 electrically connected to a second initializing source electrode S7 of the second initializing TFT T7 and the pixel electrode of the organic light-emitting diode OLED.

The operation control TFT T5 and the light-emission control TFT T6 are simultaneously turned on according to the light-emission control signal EM received via the light-emission control line EL, and thus the driving voltage ELVDD is transmitted to the organic light-emitting diode OLED such that the driving current IDLED may flow in the organic light-emitting diode OLED.

The second initializing TFT T7 includes a second initializing gate electrode G7 connected to the previous scan line SIL, the second initializing source electrode S7 connected to the light-emission control drain electrode D6 of the light-emission control TFT T6 and the pixel electrode of the organic light-emitting diode OLED, and the second initializing drain electrode D7 connected to the first initializing source electrode S4 of the first initializing TFT T4 and the initializing voltage line VL. The second initializing TFT T7 is turned on according to the previous scan signal Sn-1 received via the previous scan line SIL and initializes the pixel electrode of the organic light-emitting diode OLED.

Although the first initializing TFT T4 and the second initializing TFT T7 are connected to the previous scan line SIL in FIG. 7B, the disclosure is not limited thereto. According to another embodiment, the first initializing TFT T4 may be connected to the previous scan line SIL and operate according to the previous scan signal Sn-1, and the second initializing TFT T7 may be connected to a separate signal line (for example, a subsequent scan line) and operate according to a signal transmitted to the separate signal line.

A second storage capacitor plate CE2 of the storage capacitor Cst is connected to the driving voltage line PL, and an opposite electrode of the organic light-emitting diode OLED is connected to a common voltage ELVSS. Accordingly, the organic light-emitting diode OLED may receive the driving current $I_{OLED}$ from the driving TFT T1 and emits light, thereby displaying an image.

Although each of the compensating TFT T3 and the first initializing TFT T4 has a dual gate electrode in FIG. 7B, each of the compensating TFT T3 and the first initializing TFT T4 may have a single gate electrode.

The pixel circuit PC included in the pixel P illustrated in FIGS. 7A and 7B is applicable to the dummy pixel circuit PC' included in the dummy pixel Pd.

Figure 8:
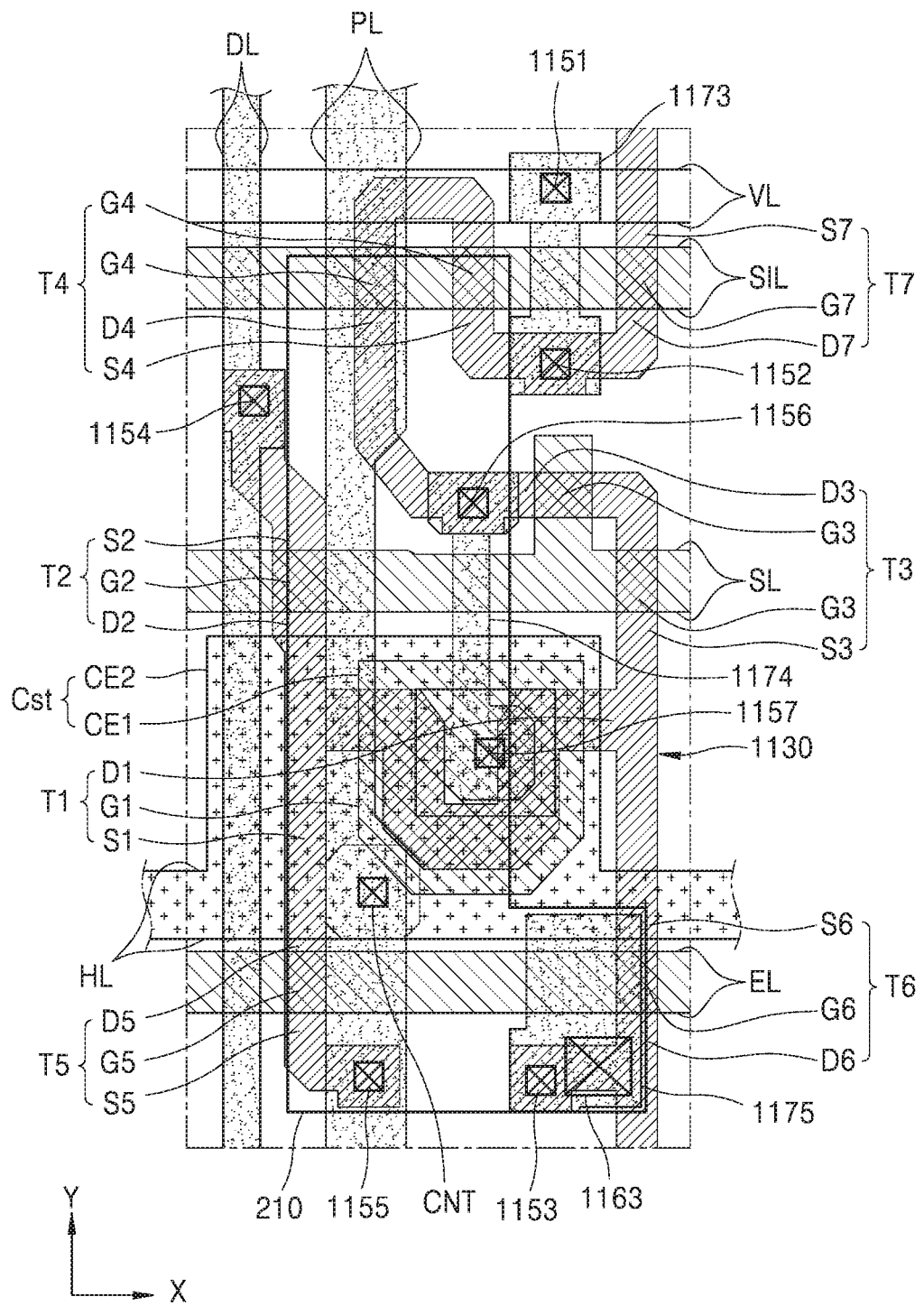
FIG. 8 is a plan view of a pixel circuit according to an embodiment.

FIG. 8 is a plan view of a pixel circuit applicable to a display panel according to an embodiment. According to the present embodiments, a dummy pixel circuit may be the same as the pixel circuit. Thus, FIG. 8 may be a plan view of a dummy pixel circuit applicable to a display panel according to an embodiment.

Referring to FIG. 8, the driving TFT T1, the switching TFT T2, the compensating TFT T3, the first initializing TFT T4, the operation control TFT T5, the light-emission control TFT T6, and the second initializing TFT T7 are arranged along a semiconductor layer 1130. The semiconductor layer 1130 may be arranged on a substrate on which a buffer layer including an inorganic insulating material is arranged.

Some regions of the semiconductor layer 1130 correspond to semiconductor layers of the driving TFT T1, the switching TFT T2, the compensating TFT T3, the first initializing TFT T4, the operation control TFT T5, the light-emission control TFT T6, and the second initializing TFT T7. In other words, it may be understood that the semiconductor layers of the driving TFT T1, the switching TFT T2, the compensating TFT T3, the first initializing TFT T4, the operation control TFT T5, the light-emission control TFT T6, and the second initializing TFT T7 are connected to each other and bent in various shapes.

The semiconductor layer 1130 includes a channel region, and a source region and a drain region on two opposite sides of the channel region. The source region and the drain region may be understood as a source electrode and a drain electrode of the relevant TFT. Hereinafter, for convenience of description, the source region and the drain region are respectively called a source electrode and a drain electrode.

The driving TFT T1 includes the driving gate electrode G1 that overlaps a driving channel region, and the driving source electrode S1 and the driving drain electrode D1 on two opposite sides of the driving channel region. The driving channel region that overlaps the driving gate electrode G1 may form a long channel within a narrow space by having a bent shape such as an omega shape. When the driving channel region is long, a driving range of a gate voltage is widened, and accordingly a gray scale of light emitted from the organic light-emitting diode OLED may be more elaborately controlled and display quality may be improved.

The switching TFT T2 includes the switching gate electrode G2 that overlaps a switching channel region, and the switching source electrode S2 and the switching drain electrode D2 on two opposite sides of the switching channel region. The switching drain electrode D2 may be connected to the driving source electrode S1.

The compensating TFT T3 is a dual TFT, and thus may include compensating gate electrodes G3 that respectively overlap two compensating channel regions, and include the compensating source electrode S3 and the compensating drain electrode D3 arranged on two opposite sides of the compensating channel regions. The compensating TFT T3 may be connected to the driving gate electrode G1 of the driving TFT T1 through a node connection line 1174 which will be described later.

The first initializing TFT T4 is a dual TFT, and thus may include first initializing gate electrodes G4 that respectively overlap two first initializing channel regions and include the first initializing source electrode S4 and the first initializing drain electrode D4 arranged on two opposite sides of the first initializing channel regions.

The operation control TFT T5 may include the operation control gate electrode G5 that overlaps an operation control channel region, and the operation control source electrode S5 and the operation control drain electrode D5 arranged on two opposite sides of the operation control channel region. The operation control drain electrode D5 may be connected to the driving source electrode S1.

The light-emission control TFT T6 may include the light-emission control gate electrode G6 that overlaps a light-emission control channel region, and the light-emission control source electrode S6 and the light-emission control drain electrode D6 arranged on two opposite sides of the light-emission control channel region. The light-emission control source electrode S6 may be connected to the driving drain electrode D1.

The second initializing TFT T7 may include the second initializing gate electrode G7 that overlaps a second initializing channel region, and the second initializing source electrode S7 and the second initializing drain electrode D7 arranged on two opposite sides of the second initializing channel region.

The aforementioned TFTs may be connected to the signal lines SL, SIL, EL, and DL, the initializing voltage line VL, and the driving voltage line PL.

The scan line SL, the previous scan line SIL, the light-emission control line EL, and the driving gate electrode G1 may be arranged on the semiconductor layer 1130 with an insulating layer(s) therebetween.

The scan line SL may extend in the first direction. Some regions of the scan line SL may correspond to the switching and compensating gate electrodes G4 and G7. For example, regions of the scan line SL that overlap the respective channel regions of the first and second initializing TFTs T4 and T7 may be the first and second initializing gate electrodes G4 and G7, respectively.

The previous scan line SIL may extend in the first direction, and some regions thereof may respectively correspond to the first and second initializing gate electrodes G4 and G7. For example, regions of the previous scan line SIL that overlap the respective channel regions of the first and second initializing TFTs T4 and T7 may be the first and second initializing gate electrodes G4 and G7, respectively.

The light-emission control line EL may extend in the first direction. Some regions of the light-emission control line EL may correspond to the operation control and light-emission control gate electrodes G5 and G6, respectively. For example, regions of the light-emission control line EL that overlap the respective channel regions of the operation control and light-emission control TFTs T6 and T7 may be the operation control and light-emission control gate electrodes G5 and G6, respectively.

The driving gate electrode G1 is a floating electrode, and thus may be electrically connected with the compensating TFT T3 through the above-described node connection line 1174.

An electrode voltage line HL may be arranged on the scan line SL, the previous scan line SIL, the light-emission control line EL, and the driving gate electrode G1 with an insulating layer(s) therebetween.

The electrode voltage line HL may extend in the first direction to intersect with the data line DL and the driving voltage line PL. A portion of the electrode voltage line HL may cover at least a portion of the driving gate electrode G1 and form the storage capacitor Cst together with the driving gate electrode G1. For example, the driving gate electrode G1 may serve as the first storage capacitor plate CE1 of the storage capacitor Cst, and a portion of the electrode voltage line HL may serve as the second storage capacitor plate CE2 of the storage capacitor Cst.

The second storage capacitor plate CE2 of the storage capacitor Cst is electrically connected to the driving voltage line PL. With regard to this, the electrode voltage line HL may be connected to the driving voltage line PL arranged on the electrode voltage line HL, through a contact hole CNT. Therefore, the electrode voltage line HL may have the same voltage level (constant voltage) as the driving voltage line PL. For example, the electrode voltage line HL may have a constant voltage of +5V. The electrode voltage line HL may be understood as a driving voltage line extending in the first direction (X direction).

Because the driving voltage line PL extends in the second direction and the electrode voltage line HL electrically connected to the driving voltage line PL extends in the first direction that intersects with the second direction, a plurality of driving voltage lines PL and a plurality of electrode voltage lines HL may constitute a mesh structure in the display area DA.

According to the present embodiment, the electrode voltage line HL may be arranged on a different layer than the layer on which the driving voltage line PL is arranged, and the electrode voltage line HL may have greater specific resistivity than the driving voltage line PL.

The data line DL, the driving voltage line PL, an initializing connection line 1173, and the node connection line 1174 may be arranged on the electrode voltage line HL with an insulating layer(s) therebetween.

The data line DL may extend in the second direction and may be connected to the switching source electrode S2 of the switching TFT T2 through a contact hole 1154. A portion of the data line DL may be understood as the switching source electrode S2.

The driving voltage line PL extends in the second direction and is connected to the electrode voltage line HL through the contact hole CNT as described above. The driving voltage line PL may also be connected to the operation control TFT T5 through a contact hole 1155. The driving voltage line PL may be connected to the operation control drain electrode D5 through the contact hole 1155.

One end of the initializing connection line 1173 may be connected to the first and second initializing TFTs T4 and T7 through a contact hole 1152, and another end of the initializing connection line 1173 may be connected to the initializing voltage line VL, which will be described below, through a contact hole 1151.

One end of the node connection line 1174 may be connected to the compensating drain electrode D3 through a contact hole 1156, and another end of the node connection line 1174 may be connected to the driving gate electrode G1 through a contact hole 1157.

The initializing voltage line VL may be arranged on the data line DL, the driving voltage line PL, the initializing connection line 1173, and the node connection line 1174 with an insulating layer(s) therebetween.

The initializing voltage line VL extends in the first direction. The initializing voltage line VL may be connected to the first and second initializing TFTs T4 and T7 through the initializing connection line 1173. The initializing voltage line VL may have a constant voltage (e.g. −2V).

The initializing voltage line VL may be arranged on the same layer on which the second storage capacitor plate CE2, namely, the electrode voltage line HL, is arranged, and may include the same material as that included in the second storage capacitor plate CE2, namely, the electrode voltage line HL. In the display area DA, the pixel electrode of the organic light-emitting diode OLED may be connected to the light-emission control TFT T6. The pixel electrode may be connected to a connection metal 1175 through a contact hole 1163, and the connection metal 1175 may be connected to the light-emission control drain electrode D6 through a contact hole 1153.

Figure 9:
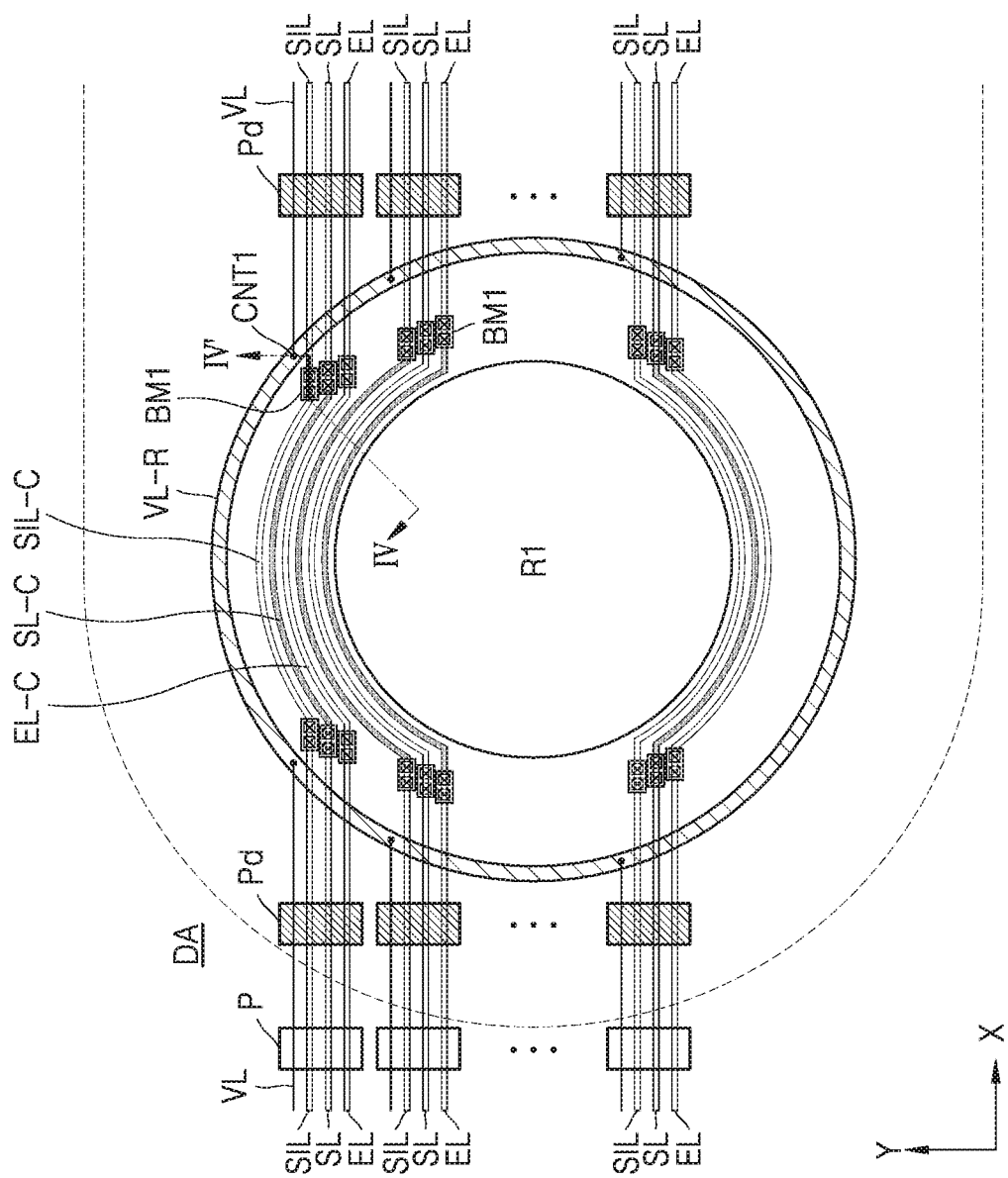
FIG. 9 is a plan view schematically illustrating an arrangement of some of the lines around a first region, according to an embodiment.
Figure 10:
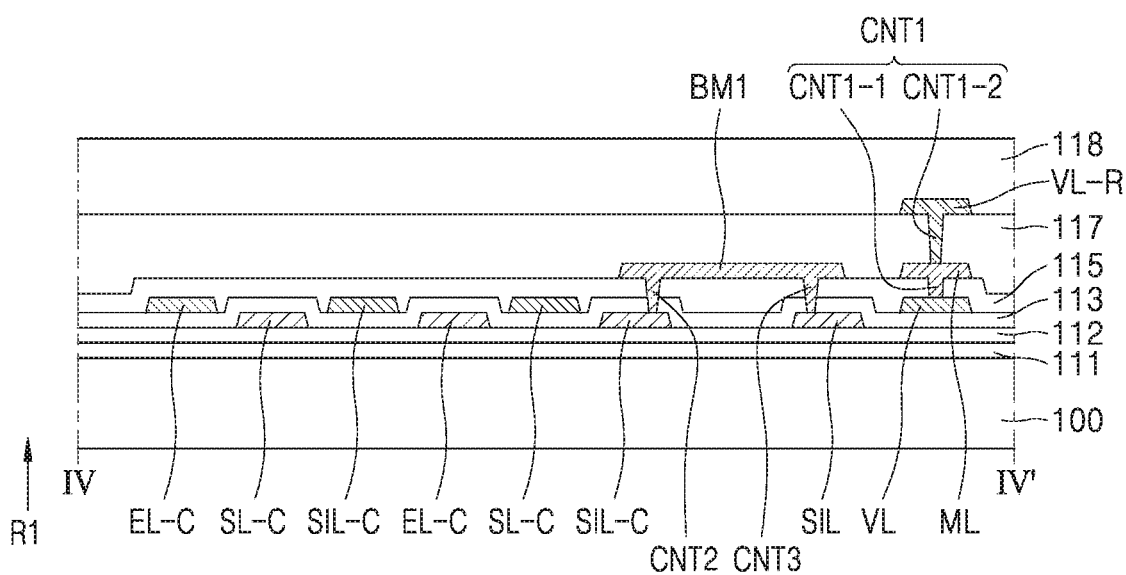
FIG. 10 is a cross-sectional view taken along line IV-IV' of FIG. 9.

FIG. 9 is a plan view of some of lines around the first region R1 in a display panel according to an embodiment, and FIG. 10 is a cross-sectional view taken along line IV-IV' of FIG. 9. The same reference numerals in FIG. 6A and FIG. 10 denote the same elements, and thus repeated descriptions thereof are omitted. In detail, FIG. 9 illustrates initializing voltage lines VL, previous scan lines SIL, scan lines SL, and light-emission control lines EL.

Although four dummy pixels Pd and two pixels P are arranged around the first region R1 in FIG. 9, more pixels and more lines may be arranged. Although FIG. 9 is described based on the first region R1, the arrangement of the lines of FIG. 9 is applicable to the second region R2.

Referring to FIG. 9, the initializing voltage lines VL, the previous scan lines SIL, the scan lines SL, and the light-emission control lines EL may each extend in the first direction (x direction), and may transmit a constant voltage and/or a signal to the pixels P and the dummy pixels Pd.

At least one of the initializing voltage lines VL, the previous scan lines SIL, the scan lines SL, and the light-emission control lines EL may be cut around the first region R1. That is, the portion of the respective lines which would have travelled in a straight line across first region R1 to overlap with first region R1 are cut to separate two cut portions on either side of the first region R1, the two cut portions not overlapping with the first region R1. Although all of the initializing voltage lines VL, the previous scan lines SIL, the scan lines SL, and the light-emission control lines EL are cut in FIG. 9, the disclosure is not limited thereto. Only some of the initializing voltage lines VL, the previous scan lines SIL, the scan lines SL, and the light-emission control lines EL may be cut, and the others may be arranged to detour around the first region R1 without being cut.

Two cut portions of each line having the first region R1 therebetween may be connected to each other by each of connection lines SIL-C, SL-C, and EL-C or an initializing electrode layer VL-R that detour around or surround the first region R1.

In other words, two cut portions of each initializing voltage line VL may be connected to the initializing electrode layer VL-R around the first region R1. Two cut portions of each previous scan line SIL may be connected to each other around the first region R1 by a previous scan connection line SIL-C. Two cut portions of each scan line SL may be connected to each other around the first region R1 by a scan connection line SL-C. Two cut portions of each light-emission control line EL may be connected to each other around the first region R1 by a light-emission control connection line EL-C.

The previous scan connection line SIL-C, the scan connection line SL-C, and the light-emission control connection line EL-C may be included to detour around an upper side or a right side of the first region R1. Although the previous scan connection line SIL-C, the scan connection line SL-C, and the light-emission control connection line EL-C are arc-shaped curves in the drawings, detouring portions thereof may be zigzagged bent lines.

The initializing voltage lines VL, the previous scan lines SIL, the scan lines SL, and the light-emission control lines EL may each be cut around the first region R1 in order to protect the pixels P and the dummy pixels Pd from ESD that may be generated around the first region R1.

Electrostatic charges may be gathered around the first region R1 capable of including at least one opening, and thus ESD is highly likely to occur. When each of the lines around the first region R1 is integrally formed with a single conductive layer, a large voltage due to ESD may be applied directly to the pixels P and/or the dummy pixels Pd without being changed.

However, according to the present embodiment, each of the lines around the first region R1 is not integrally formed with a single conductive layer and is connected to the single conductive layer via each of the connection lines SIL-C, SL-C, and EL-C or the initializing electrode layer VL-R arranged on a different layer than the layer on which the single conductive layer is arranged, and thus a large voltage due to ESD may be prevented from being applied directly to the pixels P and/or the dummy pixels Pd.

Two cut portions of each initializing voltage line VL having the first region R1 therebetween may be connected to the initializing electrode layer VL-R through first contact holes CNT1. The initializing electrode layer VL-R may have a ring shape that surrounds the first region R1.

As shown in FIG. 10, the initializing voltage line VL may be disposed on the second gate insulating layer 113, and the initializing electrode layer VL-R may be disposed on the via layer 117. The initializing electrode layer VL-R may be electrically connected to the initializing voltage lines VL through the first contact holes CNT1, and medium metals ML may be positioned between the initializing electrode layer VL-R and the initializing voltage lines VL.

The medium metals ML may be positioned on the interlayer insulating layer 115. The medium metals ML may be connected to the initializing voltage lines VL via first first contact holes CNT1-1 that penetrate through the interlayer insulating layer 115, and the initializing electrode layer VL-R may be connected to the medium metals ML through second first contact holes CNT1-2. The medium metals ML may be island metals arranged only on regions corresponding to the first contact holes CNT1, and may include the same material as that included in a data line.

The initializing electrode layer VL-R may be disposed below the additional via layer 118, and accordingly the additional via layer 118 may be positioned between the initializing electrode layer VL-R and the pixel electrode 310 (see FIG. 6A).

Respective two cut portions of each previous scan line SIL, each scan line SL, and each light-emission control line EL, the two cut portions having the first region R1 therebetween, may be connected to the previous scan connection line SIL-C, the scan connection line SL-C, and the light-emission control connection line EL-C, respectively, via first bridge metals BM1 arranged on a different layer than the layer on which the previous scan connection line SIL-C, the scan connection line SL-C, and the light-emission control connection line EL-C are arranged.

For example, as shown in FIG. 10, a first bridge metal BM1 may be arranged on the interlayer insulating layer 115, and may be connected to the previous scan connection line SIL-C and the previous scan line SIL via a second contact hole CNT2 and a third contact hole CNT3, respectively, each penetrating through the interlayer insulating layer 115 and the second gate insulating layer 113.

The previous scan lines SIL, the scan lines SL, and the light-emission control lines EL may all be arranged on the same layer. For example, the previous scan lines SIL, the scan lines SL, and the light-emission control lines EL may be arranged on the first gate insulating layer 112.

The previous scan connection line SIL-C, the scan connection line SL-C, and the light-emission control connection line EL-C may be all arranged on the same layer on which the previous scan line SIL is arranged, or at least one thereof may be arranged on a different layer than the layer on which the previous scan line SIL is arranged.

In FIG. 10, the previous scan connection line SIL-C and the light-emission control connection line EL-C are arranged on the first gate insulating layer 112, and the scan connection line SL-C is arranged on the second gate insulating layer 113. However, the disclosure is not limited thereto. For example, the previous scan connection line SIL-C and the light-emission control connection line EL-C may be arranged on the second gate insulating layer 113, and the scan connection line SL-C may be arranged on the first gate insulating layer 112. In other words, in a plane view, neighboring lines from among the lines that detour around the first region R1 may be arranged on different layers.

In general, a distance between lines close to the first region R1 and detouring around the first region R1 is less than a distance between neighboring lines in the display area DA, and accordingly a problem may be generated due to coupling between the lines detouring around the first region R1.

However, according to the present embodiment, neighboring lines among the lines detouring around the first region R1 are arranged on different layers, and thus generation of a problem due to coupling may be minimized, and a distance between the lines may be minimized, and consequently a dead space around the first region R1 is minimized.

Figure 11:
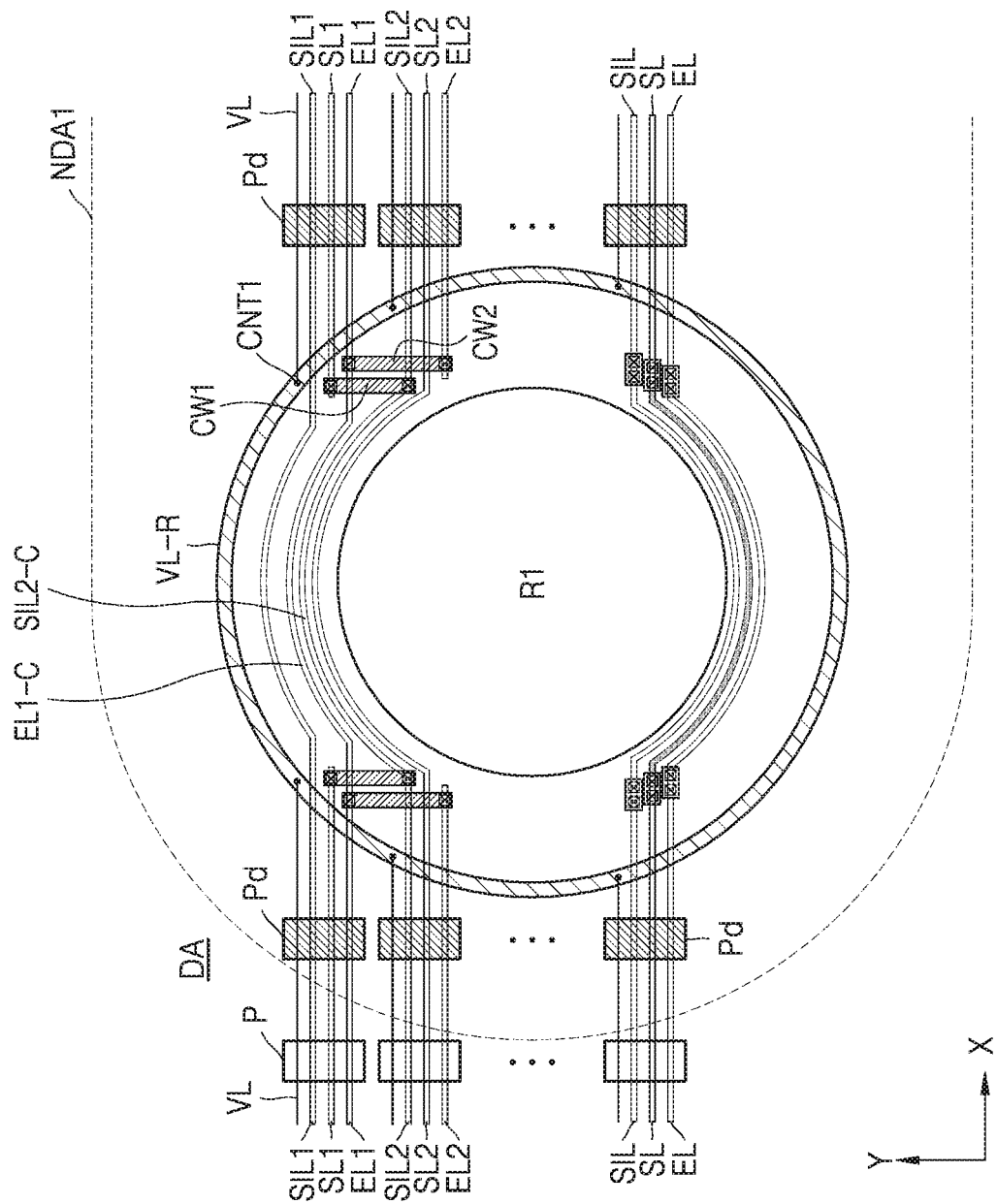
FIG. 11 is a plan view of some of the lines around a first region of a display panel according to another embodiment.

FIG. 11 is a plan view of some of the lines around the first region R1 of a display panel according to another embodiment. In detail, FIG. 11 illustrates previous scan lines SIL, scan lines SL, and light-emission control lines EL.

Referring to FIG. 11, in the first non-display area NDA1, a scan line SL of one of neighboring dummy pixels Pd may be connected to a previous scan line SIL of the other dummy pixel Pd. For example, a first scan line SL1 on a first row that transmits a scan signal to dummy pixels Pd positioned on the left and right sides of the first region R1 may be connected to a second previous scan line SIL2 on a second row in the first non-display area NDA1. For example, in the first non-display area NDA1, the second previous scan line SIL2 may be connected to the first scan line SL1 by a first connection wire CW1. The first connection wire CW1 may be position on a different layer than the layer on which the second previous scan line SIL2 and the first scan line SL1 are positioned, and may be connected to the second previous scan line SIL2 and the first scan line SL1 via respective contact holes. According to some embodiments, the first connection wire CW1 may be positioned on the interlayer insulating layer 115, which is the layer on which data lines are positioned.

Accordingly, the first scan line SL1 and the second previous scan line SIL2 may be both connected to one detouring line, for example, a second previous scan connection line SIL2-C.

According to the present embodiment, because the second previous scan line SIL2 and the first scan line SL1 detour around the first region R1 along a single detouring line, the numbers of scan lines and previous scan lines that traverse the first non-display area NDA1 may be reduced.

In the first non-display area NDA1, a light-emission control line of one of two neighboring pixels may be connected to a light-emission control line of the other pixel. For example, a first light-emission control line EL1 on the first row that transmits a light-emission control signal to dummy pixels Pd positioned on the left and right sides of the first region R1 may be connected to a second light-emission control line EL2 on the second row in the first non-display area NDA1. For example, in the first non-display area NDA1, the second light-emission control line EL 2 may be connected to the first light-emission control line EL 1 by a second connection wire CW2. The second connection wire CW2 may be positioned on a different layer than the layer on which the second light-emission control line EL 2 and the first light-emission control line EL 1 are positioned, and may be connected to the second light-emission control line EL 2 and the first light-emission control line EL 1 via contact holes, respectively. According to some embodiments, the second connection wire CW2 may be positioned on the interlayer insulating layer 115, which is the layer on which data lines are positioned. Accordingly, the first light-emission control line EL 1 and the second light-emission control line EL 2 may be both connected to one detouring line, for example, a first light-emission control connection line EL1-C.

According to the present embodiment, because the first and second light-emission control lines EL1 and EL 2 detour around the first region R1 along a single detouring line without individually detouring, the number of light-emission control lines that traverse the first non-display area NDA1, namely, the number of detouring lines of each light-emission control line, may be reduced.

In the aforementioned embodiment, it has been described that an n-th light-emission control line is connected to a detouring portion of a (n−1)th light-emission control line. However, it may be understood that the (n−1)th light-emission control line is connected to a detouring portion of the n-th light-emission control line (where n is a natural number). When an (n−1)th scan line and an n-th previous scan line are connected to each other and the (n−1)th light-emission control line and the n-th light-emission control line are connected to each other as described above, a detouring portion of a previous scan line connected to a scan line and a detouring portion of a light-emission control line connected to another light-emission control line may alternate with each other.

Although FIG. 11 illustrates a structure in which the (n−1)th scan line and the n-th previous scan line are connected to each other and the (n−1)th light-emission control line and the n-th light-emission control line are connected to each other, the disclosure is not limited thereto. According to another embodiment, the (n−1)th scan line and the n-th previous scan line may be connected to each other, but the (n−1)th light-emission control line and the n-th light-emission control line may not be connected to each other. According to another embodiment, the (n−1)th light-emission control line and the n-th light-emission control line may be connected to each other, but the (n−1)th scan line and the n-th previous scan line may not be connected to each other.

Figure 12:
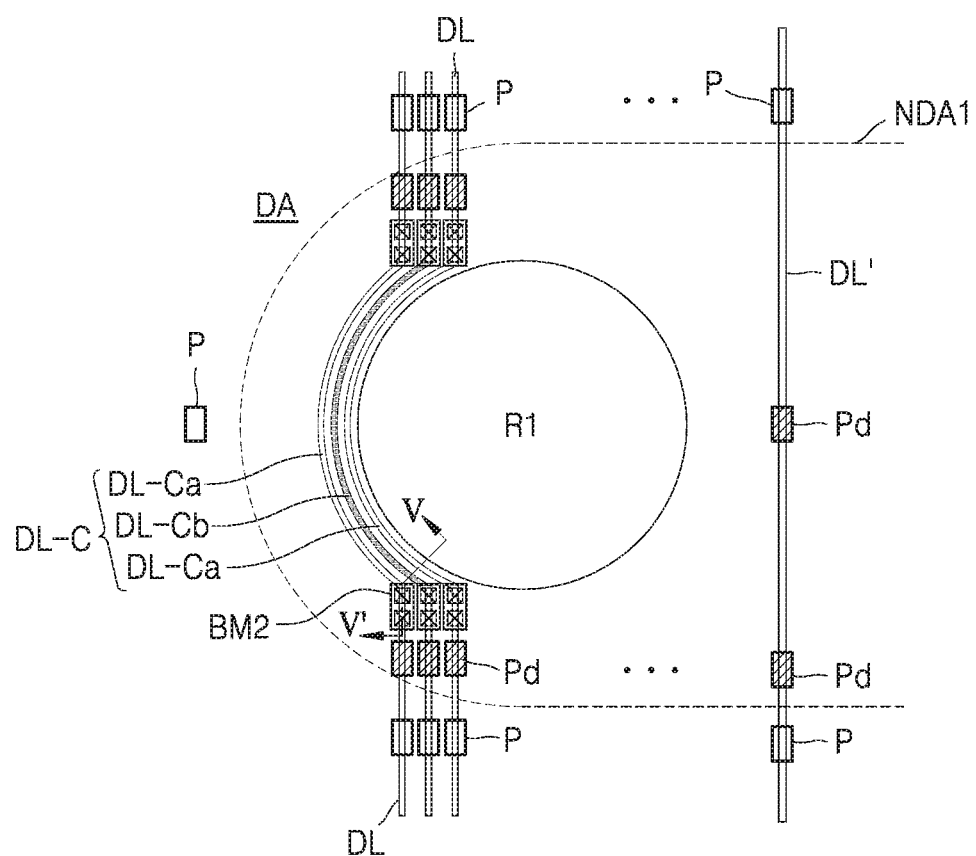
FIG. 12 is a plan view of some of the lines around a first region of a display panel according to another embodiment.
Figure 13:
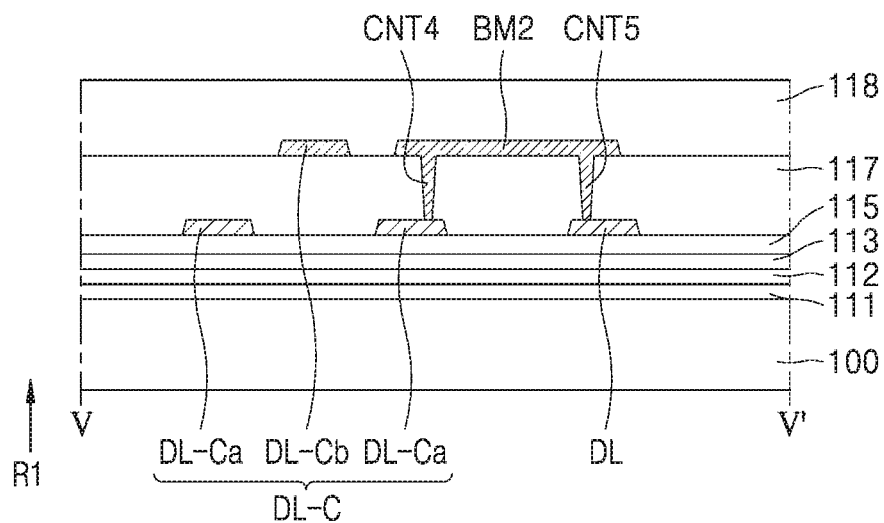
FIG. 13 is a cross-sectional view taken along line V-V' of FIG. 12.

FIG. 12 is a plan view of some of the lines around the first region R1 of a display panel according to another embodiment. In detail, FIG. 12 illustrates data lines DL. FIG. 13 is a cross-sectional view taken along line V-V' of FIG. 12.

Referring to FIG. 12, each data line DL may extend in the second direction (y direction), and may transmit a data signal to pixels P arranged in the display area DA and dummy pixels Pd arranged in the first non-display area NDA1.

Some data lines DL' positioned far from the first region R1 or the second region R2 from among the data lines DL traversing the first non-display area NDA1 may not be cut, but may each extend in the second direction in a straight line shape.

Data lines DL positioned close to the first region R1 may each be cut around the first region R1. Two cut portions of each data line DL may be connected to each other by each of data connection lines DL-Ca and DL-Cb that detour around the first region R1. Although the data connection lines DL-Ca and DL-Cb are arc-shaped curves in FIG. 12, detouring portions thereof may be zigzagged bent lines.

The data lines DL may each be cut around the first region R1 in order to protect the pixels P and the dummy pixels Pd from ESD that may occur in the first region R1.

Electrostatic charges may be gathered around the first region R1 capable of including at least one opening, and thus ESD is highly likely to occur. If each of the lines around the first region R1 is integrally formed with a single conductive layer, a large voltage due to ESD may pass through the data lines DL and may be applied directly to the pixels P and/or the dummy pixels Pd.

However, according to the present embodiment, each of the data lines DL around the first region R1 is not integrally formed with a single conductive layer and is connected to the single conductive layer via the data connection lines DL-Ca and DL-Cb arranged on a different layer than the layer on which the single conductive layer is arranged, and thus a large voltage due to ESD may be prevented from being applied directly to the pixels P and/or the dummy pixels Pd.

Referring to FIG. 13, a cut data line DL may be connected to a lower data connection line DL-Ca via a second bridge metal BM2. The second bridge metal BM2 may be positioned on the via layer 117 and may be connected to the lower data connection line DL-Ca and the data line DL via a fourth contact hole CNT4 and a fifth contact hole CNT5, respectively, each penetrating through the via layer 117. The second bridge metal BM2 may be positioned on the same layer on which an upper data connection line DL-Cb is positioned, and may have an island shape.

Lower data connection lines DL-Ca included in the data connection lines DL-C may be arranged on the interlayer insulating layer 115, which is the layer on which the data line DL is arranged. The upper data connection line DL-Cb included in the data connection lines DL-C may be arranged on the via layer 117, which is a different layer than the layer on which the data line DL is arranged.

Accordingly, the data connection lines DL-C detouring around the first region R1 may be arranged such that a lower data connection line DL-Ca and an upper data connection line DL-Cb alternate with each other, and thus a problem due to coupling between the data connection lines DL-C may be minimized, and a dead space may also be minimized.

According to embodiments, dummy pixels are arranged between regions corresponding to electronic elements, such as a sensor or a camera, and thus a pattern density and a load may be uniform and thus high-quality display panels may be provided. However, the aforementioned effects are exemplary, and effects according to embodiments will be described in detail in the descriptions below.

It should be understood that embodiments described herein should be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various changes in form and details may be made therein without departing from the spirit and scope as defined by the following claims.

What is claimed is:

1. A display panel comprising:
   a substrate including a first region, a second region, a non-display area that surrounds the first region and the second region, and a display area that surrounds the non-display area;
   a plurality of pixels arranged on the display area;
   a plurality of dummy pixels arranged on the non-display area and emitting no light;
   a plurality of signal lines configured to electrically connect the plurality of pixels to the plurality of dummy pixels;
   a plurality of connection lines spaced apart from the plurality of signal lines, and detouring around the first region;
   an insulating layer disposed over the plurality of signal lines and the plurality of connection lines; and
   a plurality of first bridge metals disposed on the insulating layer, and connecting the plurality of the connection lines and a plurality of the signal lines,
   wherein some of the plurality of dummy pixels are arranged between the first region and the second region,
   wherein the plurality of first bridge metals are arranged between the plurality of dummy pixels and the first region.

2. The display panel of claim 1, wherein the plurality of dummy pixels are arranged to surround the first region and the second region.

3. The display panel of claim 1, wherein each of the plurality of pixels comprises a pixel circuit and a display element, the pixel circuit comprising at least one transistor and the display element being connected to the pixel circuit, each of the plurality of dummy pixels comprises a dummy pixel circuit comprising at least one dummy transistor, and
a structure of the pixel circuit is a same structure as a structure of the dummy pixel circuit.

4. The display panel of claim 3, further comprising a pixel defining layer arranged on the pixel circuit and the dummy pixel circuit and comprising an opening corresponding to each of the plurality of pixels,
wherein the pixel defining layer has a flat upper surface in correspondence with the dummy pixel.

5. The display panel of claim 4, further comprising an organic emission layer arranged within the opening of the pixel defining layer in correspondence with the pixel, wherein the organic emission layer is arranged on an upper surface of the pixel defining layer in correspondence with the dummy pixel.

6. The display panel of claim 4, further comprising a first common layer, an organic emission layer, and a second common layer sequentially stacked on each other and arranged within the opening of the pixel defining layer in correspondence with the pixel,
wherein the first common layer and the second common layer contact each other on an upper surface of the pixel defining layer in correspondence with the dummy pixel.

7. The display panel of claim 4, further comprising a pixel electrode connected to the pixel circuit, an intermediate layer arranged within the opening of the pixel defining layer, and an opposite electrode arranged on the intermediate layer, in correspondence with the pixel,
wherein the opening exposes the pixel electrode, and the opposite electrode contacts an upper surface of the pixel defining layer in correspondence with the dummy pixel.

8. The display panel of claim 1, wherein
the plurality of signal lines may include signal lines each extending in a first direction and being cut around the first region, and
respective two cut portions of the cut signal lines are connected to each other by the plurality of connection lines.

9. The display panel of claim 8, wherein
some of the connection lines are arranged on a same layer on which the signal lines are arranged.

10. The display panel of claim 8, wherein neighboring connection lines from among the connection lines are arranged on different layers.

11. The display panel of claim 1, further comprising a plurality of initializing voltage lines spaced apart from each other around the first region and the second region,
wherein the plurality of initializing voltage lines are connected to each other via an initializing electrode layer in a ring shape that surrounds the first region and the second region.

12. The display panel of claim 11, wherein initializing electrode layer is arranged on a different layer than a layer on which the plurality of initializing voltage lines are arranged and is connected to the plurality of initializing voltage lines via contact holes.

13. The display panel of claim 1, wherein
the plurality of signal lines comprise:
scan lines each extending in a first direction and being cut around the first region, and scan connection lines each connecting two cut portions of each of the scan lines to each other;
previous scan lines each extending in the first direction and being cut around the first region, and previous scan connection lines each connecting two cut portions of each of the previous scan lines to each other; and
light-emission control lines each extending in the first direction and being cut around the first region, and light-emission control connection lines each connecting two cut portions of each of the light-emission control lines to each other,
wherein the scan connection lines, the previous scan connection lines, and the light-emission control connection lines may detour around the first region, and
wherein two lines neighboring each other from among the scan connection lines, the previous scan connection lines, and the light-emission control connection lines may be positioned on different layers.

14. The display panel of claim 13, wherein the scan lines comprise a first scan line connected to a first dummy pixel from among the plurality of dummy pixels,
the previous scan lines comprise a second previous scan line connected to a second dummy pixel adjacent to the first dummy pixel in a second direction that intersects with the first direction, and
the first scan line and the second previous scan line are connected to one of the scan connection lines.

15. The display panel of claim 13, wherein a second light-emission control line adjacent to a first light-emission control line from among the plurality of light- emission control lines is connected to one of the light-emission control connection lines.

16. The display panel of claim 13, wherein
the dummy pixel comprises a dummy pixel circuit, and
the dummy pixel circuit comprises:
a switching thin-film transistor connected to one of the plurality of scan lines and one of a plurality of data lines;
a driving thin-film transistor electrically connected to the switching thin-film transistor and from which a driving current corresponding to a data signal of the switching thin-film transistor flows; and
a control thin-film transistor electrically connected to the driving thin-film transistor.

17. The display panel of claim 16, wherein the dummy pixel circuit further comprises a storage capacitor that overlaps the driving thin-film transistor.

18. The display panel of claim 1, wherein the plurality of signal lines comprise:
scan lines each extending in a first direction; and
data lines each extending in a second direction intersecting with the first direction and each being cut around the first region, and
respective two cut portions of the cut data lines are connected to each other by data connection lines that detour around the first region.

19. The display panel of claim 18, wherein some of the data connection lines are arranged on a same layer on which the data lines are arranged and are connected to each other via second bridge metals arranged on a different layer than a layer on which the data lines are arranged.

20. The display panel of claim 18, wherein
the data connection lines comprise lower data connection lines arranged on a same layer on which the data lines are arranged, and upper data connection lines arranged on a different layer than the layer on which the data lines are arranged, and
the lower data connection lines and the upper data connection lines alternate with each other.

* * * * *